(12) United States Patent
Check

(10) Patent No.: US 7,534,994 B2
(45) Date of Patent: *May 19, 2009

(54) LASER SCANNING SYSTEM EMPLOYING LASER MODE SWITCHING USING A BINARY MODE SWITCHING SIGNAL

(75) Inventor: Frank Check, San Jose, CA (US)

(73) Assignee: Metrologic Instruments, Inc., Blackwood, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/810,054

(22) Filed: Jun. 4, 2007

(65) Prior Publication Data

US 2007/0295921 A1 Dec. 27, 2007

Related U.S. Application Data

(63) Continuation of application No. 10/730,874, filed on Dec. 9, 2003, now Pat. No. 7,227,115, which is a continuation of application No. 09/816,642, filed on Mar. 23, 2001, now Pat. No. 6,686,586.

(51) Int. Cl.
*H01J 7/24* (2006.01)
(52) U.S. Cl. ...................... 250/238; 250/205
(58) Field of Classification Search ............ 250/238, 250/235, 205, 214 R; 372/34, 12, 6, 20, 372/28, 43, 32; 359/204, 205
See application file for complete search history.

(56) References Cited

U.S. PATENT DOCUMENTS

| | | | |
|---|---|---|---|
| 3,541,300 A | 11/1970 | Studuik et al. | |
| 3,588,738 A | 6/1971 | Goodwin | |
| 3,628,173 A | 12/1971 | Danielmeyer | |
| 4,309,671 A | 1/1982 | Malyon | |
| 4,485,475 A | 11/1984 | Large et al. | |
| 4,548,463 A | 10/1985 | Cato et al. | |
| 4,571,728 A | 2/1986 | Yoshikawa | |

(Continued)

OTHER PUBLICATIONS

Web-based product brochure for the PLVS-Series Pulsed Violet Laser Sources by TuiOptics, www.tuioptics.com, 2000, pp. 1-4.

(Continued)

*Primary Examiner*—Que T Le
(74) *Attorney, Agent, or Firm*—Thomas J. Perkowski, Esq. P.C.

(57) ABSTRACT

A diffractive-based laser scanning system that monitors portions of the laser light beams generated by a laser light source (e.g., VLD) employed therein to generate a mode switching signal indicative of a shift in the characteristic wavelength of the laser light beams emitted from the laser light source. In response thereto, a temperature controller selectively heats or cools the laser light source to minimize and avoid such wavelength changes. Mode switching is detected by monitoring a zeroth diffractive order beam produced by a diffractive element of the system. Temperature control of the laser light source is accomplished using active heating elements and passive cooling elements in thermal contact with the laser light source. In addition, temperature control of the laser light source is preferably accomplished over a heating range, whereby temperature within this range is approximated by a look-up table.

19 Claims, 27 Drawing Sheets

U.S. PATENT DOCUMENTS

| | | |
|---|---|---|
| 4,583,228 A | 4/1986 | Brown et al. |
| 4,631,728 A | 12/1986 | Simons |
| 4,695,714 A | 9/1987 | Kimizuka et al. |
| 4,733,253 A * | 3/1988 | Daniele ................. 347/247 |
| 4,737,798 A | 4/1988 | Lonis |
| 4,792,957 A | 12/1988 | Kollanyi |
| 4,834,477 A | 5/1989 | Tomita et al. |
| 5,088,098 A | 2/1992 | Muller |
| 5,118,964 A | 6/1992 | McArdle |
| 5,181,214 A | 1/1993 | Berger et al. |
| 5,640,407 A | 6/1997 | Freyman et al. |
| 6,092,728 A | 7/2000 | Li et al. |
| 6,154,474 A | 11/2000 | Yoshida |

OTHER PUBLICATIONS

Product brochure for the LM119/LM219/LM319 High Speed Dual Comparator by National Semiconductor Corporation, Aug. 2000, pp. 1-11.

Header file entitled "P12C509.Inc Standard Header File 1.02" by Microchip Technology, Inc., pp. 1-3.

Product brochure for the Mitsubishi Laser Diodes ML4XX26 Series by Mitsubishi Electric, Inc., Feb. 2000, pp. 1-4.

Product manual for the Microchip PIC12C5XX by Microchip Technology Inc., 1999, pp. 1-112.

Scientific publication entitled. "Non-Contact Dimensional Measurement System using Holographic Scanning" by Stephen F. Sagan, Robert S. Rosso, David M. Rowe, SPIE, vol. 3131, pp. 224-231.

* cited by examiner

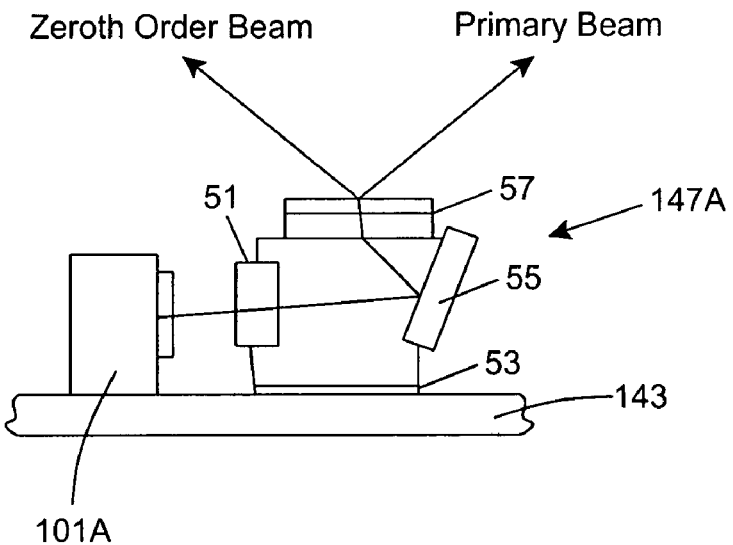
FIG. 5(E)(i)
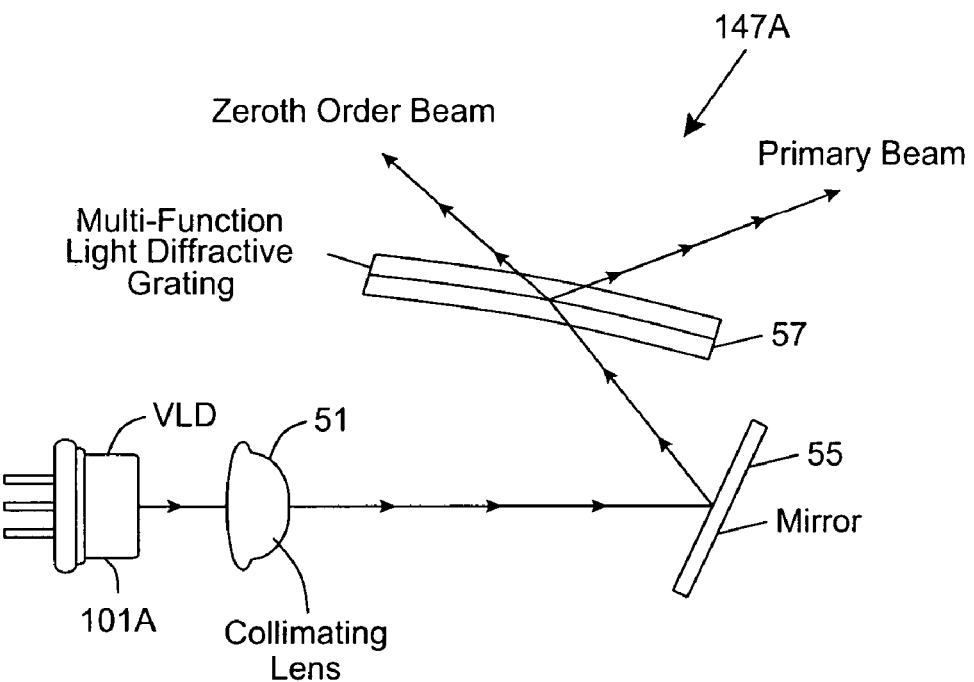
FIG. 5(E)(ii)

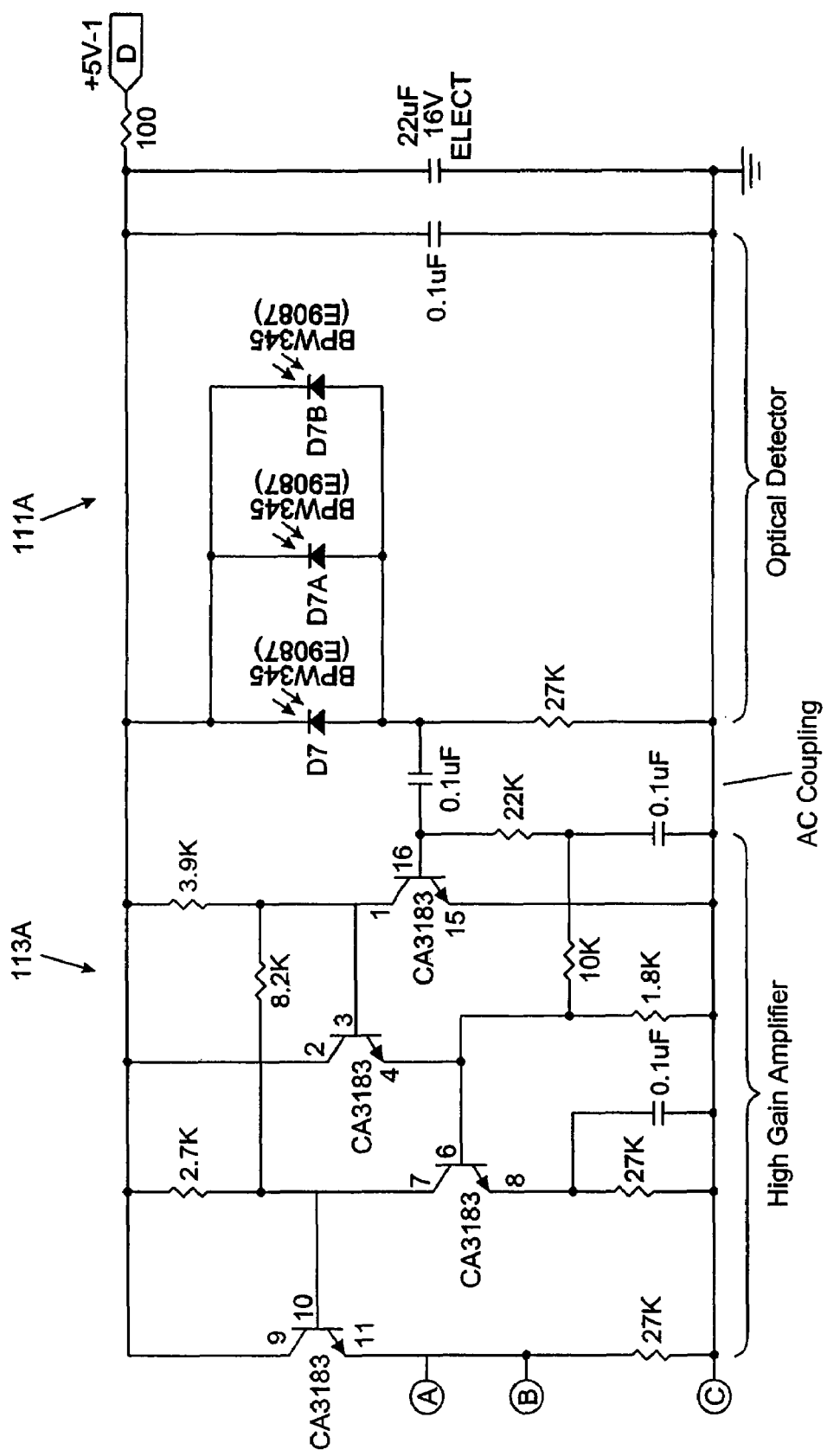
FIG. 7(A)(ii)

```
10 init:
15     direction= UP;
20 main_loop:
25          if mode_switching = ON then:
30               if Direction – UP then
40 heat_loop
50                    heat laser light source (set PW = 100%)
60                         if mode_switching – OFF then
70                              calculate new_PW to maintain temp
80                              set PW to new_PW
90                              jump to main_loop
100                        else
110                             if top_of_range_reached then
115                                  Direction = DOWN;
120                                  jump to heat_loop;
130                             else
140                                  jump to heat_loop;
150                             end if;
160                        end if;
170                   else /*****Direction = DOWN*****/
180                        cool laser light source (set W = 0%)
185                        if mode_switching = OFF then
190                             calculate new_PW to maintain temperature;
200                             set PW to new_PW
210                             jump to main_loop
220                        else
230                             if bottom_of_range_reached then
235                                  Direction = UP;
240                                  jump to heat_loop;
250                             else
260                                  jump to cool_loop;
270                             end if;
275                        endif;
280          else
290               use PW to maintain temperature
300               jump to main_loop
310          endif;
320 end
```

FIG. 8(A)

```
10  main_loop
20    if mode_switching = ON then begin:
30      if heat_power = lower (PW <=50%) then
40  heat_loop:
50              heat laser light source (set PW = 100%)
60                if mode_switching = OFF then
70                  calculate new_PW to maintain temp
80                  set PW to new_PW
90                  jump to main _loop
100               else
110                 if top_of_range_reached then
120                   jump to cool_loo;
130                 else
140                   jump to heat_loop;
150                 end if;
160               end if;
170       else /*****heat_power=high (PW>50%) ****/
175  cool_loop:
180             cool laser light source (set PW = 0%)
185               if mode_switching = OFF then
190                 calculate new_PW to maintain temperature;
200                 set PW to new_PW
210                 jump to main_loop
220               else
230                 if bottom_of_range_reached then
240                   jump to heat_loop;
250                 else
260                   jump to cool_loop;
270                 end if;
275               endif;
280       end if;
285   else
290     use PW to maintain temperature
300     jump to main_loop
310   endif;
320  end
```

FIG. 8(B)

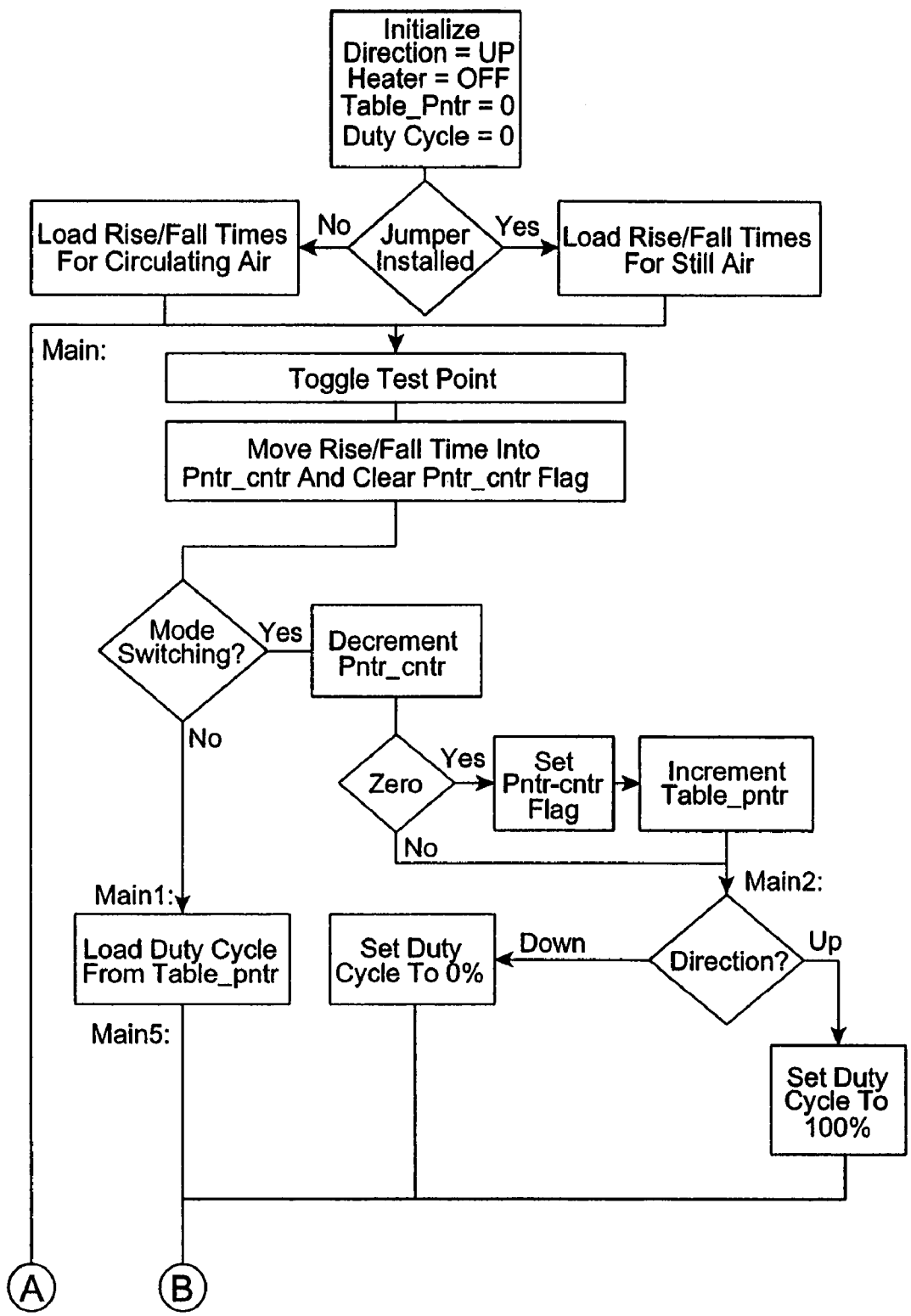
FIG. 8(C)(i)1

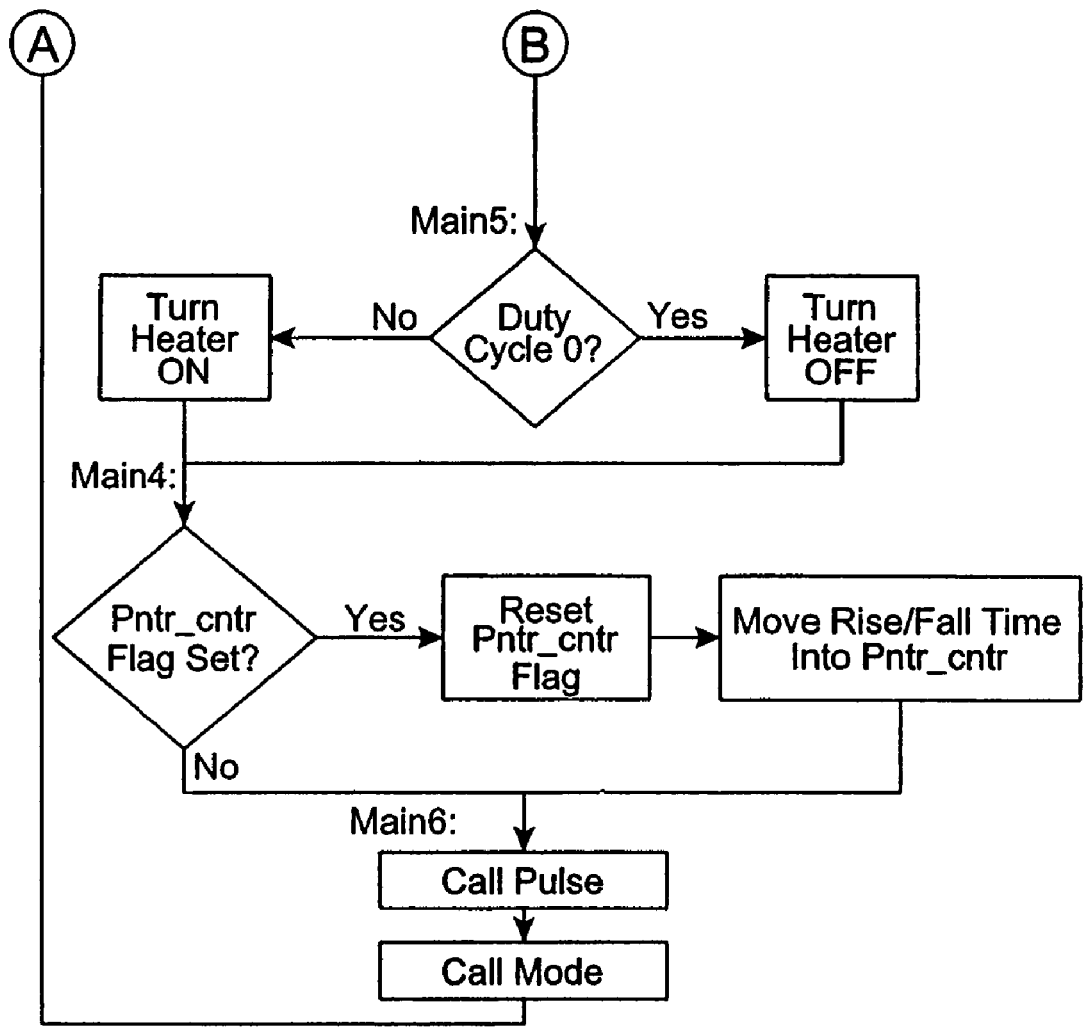
FIG. 8(C)(i)2

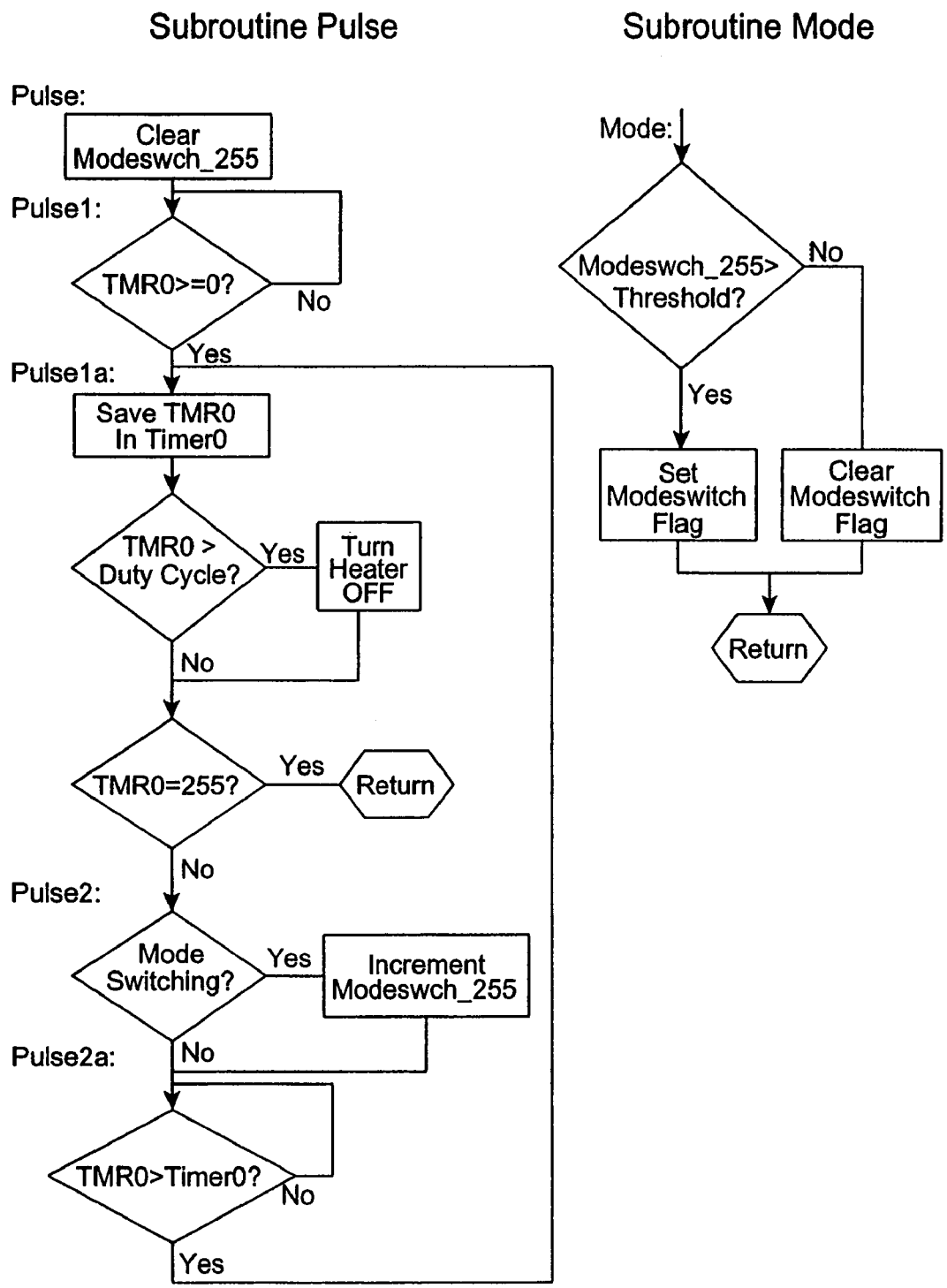
FIG. 8(C)(ii)

```
        list        p=12c5-0           ; list directive to define processor
        #include    <o12c509.inc>      ; processor specific variable definitions __CONFIG    _CP_OFF & _WDT_OFF & _MCLR_OFF & _IntRC_OSC ; '__CONFIG' directive is used to embed configuration word within .asm filed.
; The labels following the directive are located in the respective .inc file.
; See respective data sheet for additional information on configuration word.

;***** VARIABLE DEFINITIONS
; Labels for variables
threshold           EQU  0x25   ; set threshold level for mode switching
modeswitch          EQU  0x30   ; Input signal location
heater              EQU  0x00   ; Output signal location
TP                  EQU  0x02   ; Test Point location
rise1               EQU  D'120' ; first rise time (120*2 seconds) jumper IN
rise2               EQU  D'45'  ; second rise time (45*2 seconds) jumper OUT
fall1               EQU  D'120' ; first fall time (120*2 seconds) jumper IN
fall2               EQU  D'45'  ; second fall time (45*2 seconds) jumper OUT ; Labels for memory locations
temp                EQU  0x07   ; example variable definition
duty_cycle          EQU  0x08   ; Pulse width modulation
modeswitch_255      EQU  0x09   ; counter to keep track of mode switching
timer0              EQU  0x0a   ; keep track of timer changes
rise                EQU  0x0b
fall                EQU  0x0c
table_pntr          EQU  0x0d
flags               EQU  0x0e
pntr_cntr           EQU  0x0f ;****************************************************************
        ORG     0x3FF           ; processor reset vector
; Internal RC calibration value is placed at location 0x1FF by Microchip
; as a movlw kk, where the kk is a literal value.

ORG     0x000           ; coding begins here
        movwf   OSCCAL          ; update register with factory cal value ; remaining code goes here

;****************INITIALIZE
```

FIG. 8(D)(i)

```
        MOVLW       0xc7           ; set up timers etc.
        OPTION

MOVLW       0x3a           ; set up I/O
        TRIS        6

CLRF        duty_cycle     ; set initial duty cycle to 0
        BCF         GPIO, heater   ; turn off heater
        BSF         GPIO, heater   ; turn off heater drive transistor MOVLW       rise1          ; Initialize rise and fall times to
        BTSFC       GPIO,5         ; setting setting, predetermined constants
        MOVLW       rise2
        MOVWF       rise
        MOVWF       pntr_cntr      ; initialize with rise time MOVLW       fall1
        BTFSC       GPIO,5
        MOVLW       fall2
        MOVWF       fall CLRF        flags
        CLRF        table_pntr

;*****************MAIN LOOP main:
        BSF         GPIO,TP        ; Toggle test point
        BCF         GPIO,TP BCF         flags,1        ; clear pntr_cntr flag BTFSS       flags,0        ; test mode switch flag
        GOTO        main1          ; jump if not set DECFSZ      pntr_cntr,1    ; if not 0, skip
        GOTO        main2
        BSF         flags,1        ; set pntr_cntr flag
        INCF        table_pntr     ; advance through table main2:
        MOVLW       0xff           ; load 'up' direction
        MOVWF       duty_cycle     ; set for up direction
        BTFSC       table_pntr,5   ; if in 'up' direction, skip
        CLRF        duty_cycle
        GOTO        main5
```

FIG. 8(D)(ii)(a)

```
main1;
        MOVF       tabl_pntr,0    ; load table pointer in working register
        ANDLW      0x3f           ; strip off higher order bits
        CALL       table          ; fetch duty cycle from lookup table
        MOVWF      duty_cycle     ; load in duty cycle
main5:
        MOVF       duty_cycle,0   ; read in duty cycle
        BTFSS                 STATUS,Z    ; if nonzero goto main3
        GOTO       main3
;       BCF        GPIO,0         ; if zero, turn OFF output
        BSF        GPIO,heater    ; if zero, turn OFF, heater drive transistor
        GOTO       main4
main3:
;       BSF        GPIO,0         ; turn ON output
        BCF        GPIO, heater   ; turn ON heater drive transistor
main4:
        BTFSS                 flags,1    ; if flag is set, reset pntr_cntr
        GOTO       main6
        MOVF       rise,0         ; reset pntr_cntr
        BTFSC      table_pntr,5   ; reset pntr_cntr
        MOVF       fall,0
        MOVWF      pntr_cntr
main6:
        CALL       pulse          ; pulse width modulation subroutine
        CALL       mode           ; update modeswitching, set mode bit
        GOTO       main           ; go back to main routine
```

FIG. 8(D)(ii)(b)

*SUBROUTINES

```
mode:                                    ; include mode switching
    BCF     flags,0                      ; clear mode switching flag
    MOVLW   threshold                    ; put threshold value in accumulator
    SUBWF   modeswitch_255,0             ; compare
    BTFSC   STATUS,C                     ; if modewsitch_255>threshold
    BSF     flags,0                      ; set flag0
    RETLW   0                            ; set flag
```

; Subroutine to generate pulse width modulation, monitor mode switching
; Prescaler set to 256  Therefore each pass is 256 usec, 256 passes produces
; 65 ms basic period for mode switching.

```
pulse:
    CLRF    modeswitch_255               ; Initialize mode switching register
pulse1:
    INCF    TMR0,0                       ; wait until TMR0 increments past 0xFF
    BTFSC   STATUS,Z
    GOTO    pulse1
pulse1a:
    MOVF    TMR0,0                       ; load timer into W
    MOVWF   timer0                       ; put in timer0 monitor MOVF    timer0,0                     ; move timer0 monitor into W
    SUBWF   duty_cycle,0                 ; compare duty cycle with timer0
    BTFSS           STATUS,C             ; if borrow occurs, then
    BCF     GPIO, heater                 ; clear output
    BSF     GPIO, heater                 ; turn OFF heater transistor INCFSZ  timer0,0                     ; if timer – 255, exit from loop
    GOTO    pulse2
    RETLW   0
```

FIG. 8(D)(iii)(a)

LASER SCANNING SYSTEM EMPLOYING LASER MODE SWITCHING USING A BINARY MODE SWITCHING SIGNAL

RELATED CASES

The present application is a Continuation of U.S. application Ser. No. 10/730,874 filed Dec. 9, 2003; now U.S. Pat. No. 7,227,115 which is a Continuation of U.S. application Ser. No. 09/816,642 filed Mar. 23, 2001, now U.S. Pat. No. 6,686,586; each said Application being assigned to Metrologic Instruments, Inc. and incorporated herewith.

BACKGROUND OF THE INVENTION

1. Field of the Present Invention

The present invention relates, generally, to laser scanning systems, and, more particularly, to laser scanning systems that utilize at least one diffractive optical element to direct laser light beams through a scanning region.

2. Brief Description of the State of the Art

Laser scanning systems utilize a laser light source (such as a visible laser diode (VLD)) and optical elements to direct laser light beams through a scanning region, and optical elements, photodetector(s) and analog/digital processing circuitry to collect, capture and analyze the returning (i.e. incoming) laser light beams reflecting off light reflective surfaces (e.g. product surfaces, bar code symbols, etc).

One class of laser scanning systems (hereinafter referred to as "Diffractive-Based Laser Scanning Systems) utilize one or more diffractive optical elements to direct the outgoing laser light and/or collect the incoming laser light. A diffractive optical element (referred to below as a "DOE") is an optical structure that operates on the principle of diffraction—it breaks up an incident laser light beam into a large number of waves, which recombine to form completely new waves. A DOE can function as a grating, lens, aspheric or any other optical element. Diffractive-based laser scanning systems include holographic laser scanning systems that use one or more multi-faceted holographic optical elements to direct the outgoing laser light through the scanning region and collect the incoming laser light for capture by the photodetector(s).

As shown in FIG. 1, an exemplary diffractive-based laser system 100 employs a laser light source 101 (such as a solid state VLD) that emits laser light beams (denoted I") having a characteristic wavelength. An optical subsystem 103 directs portions (denoted I) of these laser light beams into a scanning region 105. The returning (i.e., incoming) laser light beams (denoted I") from the scanning region 105, which reflect off light reflective surfaces in the scanning region 105, are collected by the optical subsystem 103 and portions (denoted I'") of the returning laser light beams are directed to photodetector(s) 107 and signal processing and control circuitry 109 that capture and analyze the returning laser light beam portions to identify properties (such as bar code symbols, spatial dimensions, spatial profiles, and velocity) of the surfaces within the scanning region. The optical subsystem 103 utilizes at least one diffractive optical element (DOE) in directing the laser light beams I' into the scanning region 105, collecting the returning laser light beams I", and/or directing the portions of the returning laser light beams I'" to the photodetector(s) 107.

Laser light sources, such as solid-state VLDs, typically exhibit mode switching, which manifests itself as a shift in the characteristic wavelength of light emitted from the laser light source. Mode switching can occur at frequencies ranging from a few hertz to several hundred kilohertz. In systems using VLDs, mode switching is related to the temperature of the VLD. More specifically, as the temperature of the VLD varies, the physical dimensions and characteristics of the semiconductor material of the VLD change, thereby favoring operation at various wavelengths (i.e., modes). In addition, mode switching can be induced by optical feedback into a laser source (e.g., VLD).

In diffractive-based laser scanning systems, including holographic laser scanning systems, mode switching of a laser light source can potentially cause unwanted variations in the amplitude and direction of light directed through the scanning region, as well as unwanted variations in cross-sectional dimensions and beam shape of the laser scanning beams. If such variations are significant, the light beams entering the scanning region may not move uniformly through the scanning region (as designed), instead jumping rapidly about its expected position. This results in an effectively larger "spot" size of the light beam at its focal point in the scanning region, which may lead to unwanted distortion and signal processing errors, for example, errors in the resolution of the bars and spaces of scanned code symbols and, often, intolerable symbol decoding errors.

Such variations result from the optical characteristics of the diffractive optical elements used therein. More specifically, the amplitude and direction (and other optical properties) of the diffracted light beam output from a diffractive optical element is sensitive to wavelength of the incident beam. In other words, the amplitude and direction of the diffracted light beam output from the diffractive element is a function of wavelength of the incident beam. Thus, variations in wavelength of the light beam incident on such diffractive optical elements can cause unwanted variations in amplitude and direction of the diffracted beam, which may result in non-uniform movement and distortion of the light beam directed through the scanning region and unwanted signal processing errors (for example, errors in the resolution of the bars and spaces of scanned code symbols and, often, intolerable symbol decoding errors) as described above.

Thus, there is a great need in the art for an improved diffractive-based laser scanning system that minimizes the effects of mode switching (shift in characteristic wavelength) of laser light sources employed therein, while avoiding the shortcomings and drawbacks of prior art diffractive-based scanning systems and methodologies.

OBJECTS AND SUMMARY OF THE PRESENT INVENTION

Accordingly, a primary object of the present invention is to provide a diffractive-based laser scanning system free of the shortcomings and drawbacks of prior art laser scanning systems and methodologies.

Another object of the present invention is to provide a diffractive-based laser scanning system (for example, holographic laser scanning system or holographic LDIP system) including mode switching detection elements that monitor a portion of the laser light beams produced by a laser light source and generate a mode switching control signal indicative of change in characteristic wavelength of the laser light beams generated by the laser light source; a temperature control element, in thermal contact with the laser light source, that is capable of adjusting temperature of the laser light source; and control circuitry, operably coupled between the mode switching detection elements and the temperature control element, that controls the temperature control element to adjust temperature of the laser light source based upon the mode switching control signal.

Another object of the present invention is to provide a diffractive-based laser scanning system (for example, holographic laser scanning system or holographic LDIP system) that includes mode switching detection elements operably coupled to temperature control elements that cooperate to adjust temperature of the laser light source to decrease variation of the characteristic wavelength of the laser light source.

Another object of the present invention is to provide a diffractive-based laser scanning system (for example, holographic laser scanning system or holographic LDIP system) wherein a zeroth diffractive order beam is produced by at least one diffractive optical element, and wherein the variations in intensity of the zeroth order beam is monitored to detect and characterize mode switching of the laser light source (e.g., VLD) employed in the system.

Another object of the present invention is to provide a diffractive-based laser scanning system (for example, holographic laser scanning system or holographic LDIP system) that controls temperature of the laser light source (to correct for mode switching of the laser light source) using an active heating element (e.g., heating resistor) and a passive cooling element (e.g., heat sink).

Another object of the present invention is to provide a diffractive-based laser scanning system (for example, holographic laser scanning system or holographic LDIP system) that utilizes simple, efficient and low cost optical elements and circuit elements in monitoring mode switching of the laser light source (e.g., VLD) and correcting for such mode switching.

Another object of the present invention is to provide a diffractive-based laser scanning system (for example, holographic laser scanning system or holographic LDIP system) that utilizes simple, efficient and low cost circuitry and thermal control elements in controlling the temperature of the laser light source (e.g., VLD) to correct for mode switching of the laser light source (e.g., VLD).

Another object of the present invention is to provide a diffractive-based laser scanning system (for example, holographic laser scanning system or holographic LDIP system) that utilizes low cost circuitry to approximate the temperature of the laser light source (e.g., VLD) over operational time when adjusting the temperature of the laser light source (e.g., VLD) to correct for mode switching of the laser light source (e.g., VLD), thereby eliminating the need for expensive circuitry in directly measuring the temperature of the laser light source (e.g., VLD).

A further object of the present invention is to provide a diffractive-based laser scanning system (for example, holographic laser scanning system or holographic LDIP system) that utilizes simple, efficient, and low cost optical elements and circuit elements in monitoring mode switching of the laser light source (e.g., VLD) and correcting for such mode switching over the operational lifetime of the laser light source (e.g., VLD) without the need for extensive characterization of the operational characteristics of the laser light source (e.g., VLD) when building the system and/or during its operational lifetime.

A further object of the present invention is to provide novel temperature control mechanisms that utilize simple, efficient and low cost circuitry and thermal control elements in controlling the temperature of the laser light source (e.g., VLD) to correct for mode switching of the laser light source (e.g., VLD).

A further object of the present invention is to provide novel temperature control mechanisms that utilize a programmable low cost microcontroller in conjunction with low cost thermal control elements in controlling the temperature of the laser light source (e.g., VLD) to correct for mode switching of the laser light source (e.g., VLD).

These and other objects of the present invention will become apparent hereinafter and in the Claims to Invention.

BRIEF DESCRIPTION OF THE DRAWINGS

In order to more fully understand the Objects of the Present Invention, the following Detailed Description of the Illustrative Embodiments should be read in conjunction with the accompanying Figure Drawings in which:

FIGS. 3(A)-(B) illustrate the open-loop operation of the system 100' (wherein the temperature controller is not operational), thereby depicting the problems addressed by the closed-loop operation of the system 100' (wherein the temperature controller is operational) as illustrated in FIGS. 4(A)-(B).

FIG. 5(E)(i) is a schematic illustration of a laser production module for one (LS1) of the laser scanning stations of the holographic laser scanning system 100-A of the present invention as illustrated in FIGS. 5(A), 5(B) and 5(C) including: a visible laser diode (VLD) 101A, an aspheric collimating lens 51 supported within the bore of a housing 53 mounted upon an optical bench 143 of the module housing for collimating the laser light produced by the VLD 101A; a mirror 55, supported within the housing 53, for directing the collimated laser light produced by lens 51 to a multi-function light diffractive grating 57 supported by the housing 53; the multi-function light diffractive grating 57, which has a fixed spatial frequency and is disposed at incident angle relative to the outgoing laser beam provided by the mirror 55, produces a primary beam that is directed toward the facets of the rotating scanning disk 130 and a zeroth diffraction order beam (whose intensity is relatively weak compared to the intensity of the primary beam output therefrom); the multi-function light diffractive grating 57 changes the properties of the incident laser beam so that the aspect ratio of the primary beam is controlled, and beam dispersion is minimized upon the primary laser beam exiting the holographic scanning disc 130.

FIG. 5(E)(ii) is a schematic illustration of the optical elements of the laser production module of FIG. 5(E)(i).

through a scanning plane (along multiple depths of focus) through a light transmission aperture 3373A formed in the housing 3373; a parabolic light collecting mirror 3375 mounted beneath the holographic scanning disc 3370 collects reflected laser light off a scanned object (e.g. package) and focusing the same through a condenser-type lens 3376 onto a photodetector 3344 (for example, one or more an avalanche-type photo-diode devices) mounted below the scanning disc 3370, and producing an electrical signal corresponding thereto; signal processing circuitry processes the produced electrical signal and generating raw digital range data representative of the distance from the holographic scanning element to sampled points along the scanned object (as well digital scan data representative of any bar code symbol the scanned surface of the object); an image processor preprocesses the raw digital range data to remove background information components, and processes the preprocessed range data so as to extract information regarding the dimensions (e.g. area, height, length, width, and/or vertices) and other physical attributes of the scanned object and produce data representative thereof as well as the velocity or other image data of the scanned object.

Figure 6A:
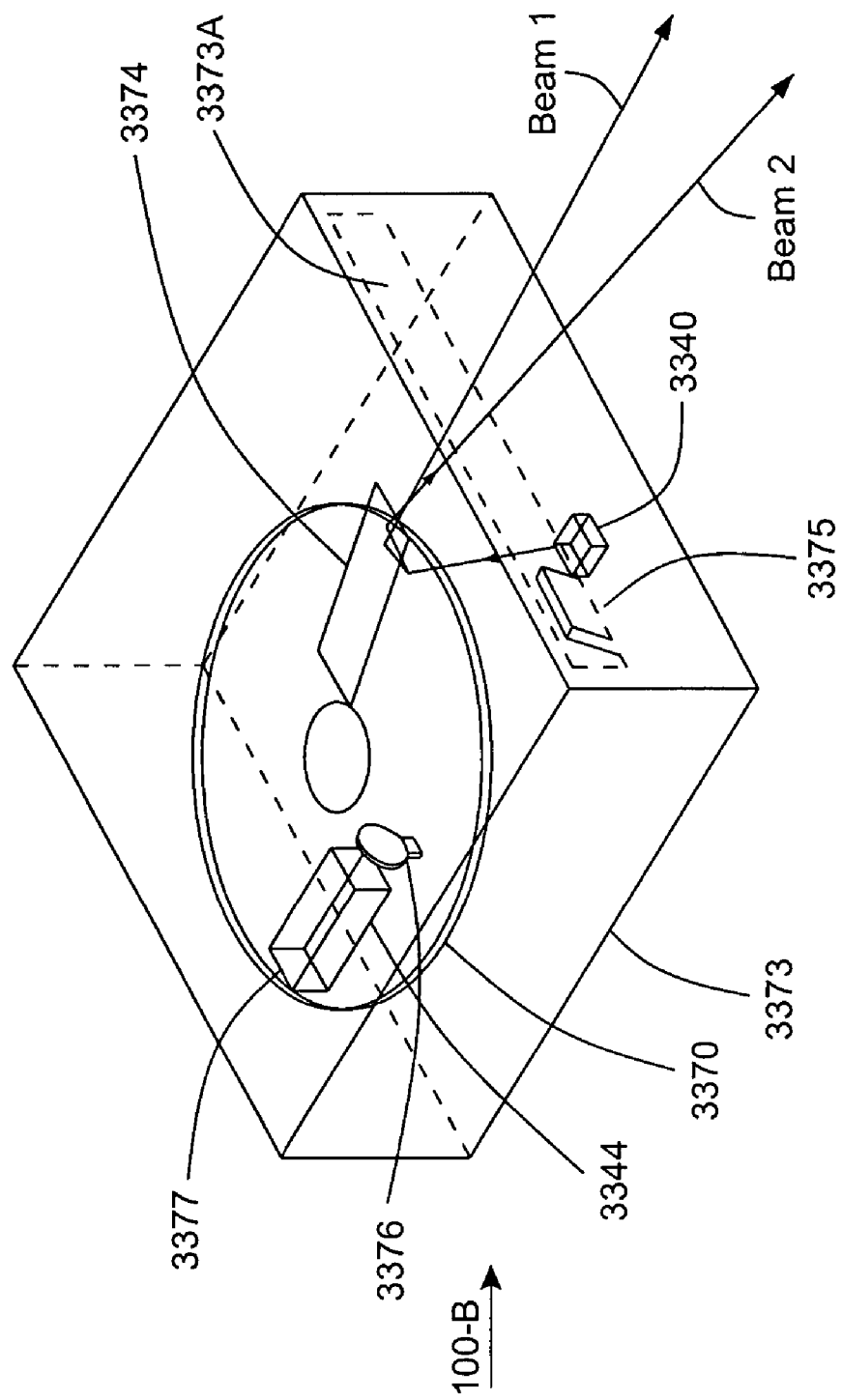
FIG. 6(A) is a schematic illustration of a holographic laser dimensioning, imaging and profiling system (holographic LDIP system) of the present invention realized so that one or more amplitude modulated (AM) laser scanning/ranging beams (two shown) are projected from its housing 3373 (i.e. optical bench); a holographic scanning disc 3370, rotatably mounted on an optical bench within the housing 3373, may generate multiple amplitude modulated laser beams (two shown) from the amplitude modulated laser beam produced from the laser beam production module 3340), and project each AM modulated beam generated therein (two shown)
Figure 6B:
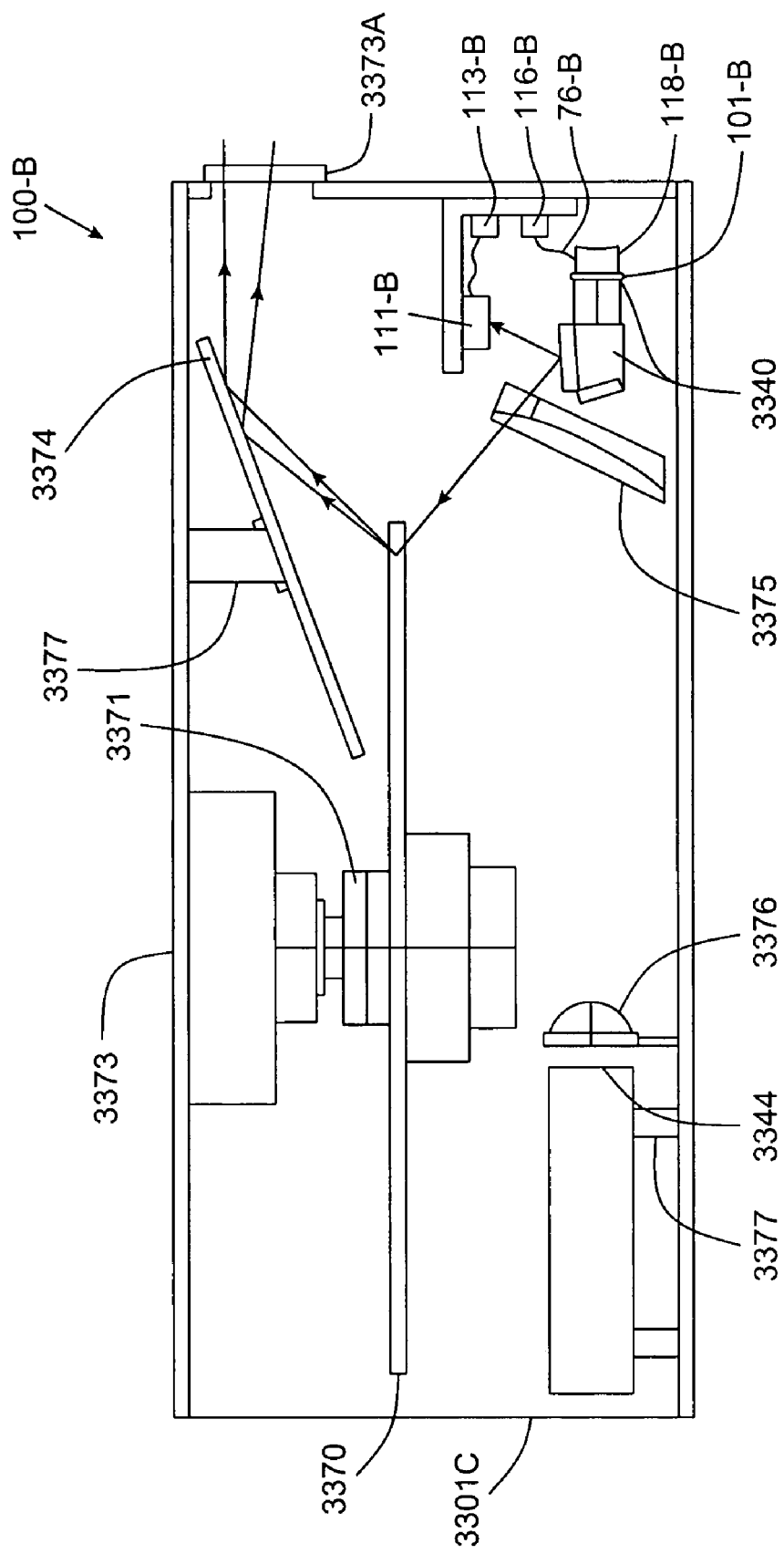

FIG. 6(B) is a schematic illustration of the holographic LDIP system of the present invention including a photodetector 111-B that is supported within the housing 3373 of the holographic LDIP system such that it intercepts the zeroth diffraction order as the amplitude modulated laser beam is transmitted from a diffractive optical element of a laser beam production module 3340; the photodetector 111-B produces a first electrical signal 112-B indicative of the detected intensity the zeroth diffraction order laser beam emitted from the diffractive optical element; the first electrical signal 112-B generated by the photodetector 111-B is supplied to signal processing circuitry 113-B that generates a mode switching signal 114-B representing change in characteristic wavelength of the laser light beam emitted from the VLD 101-B based upon the first electrical signal 112-B; the mode switching signal 114-B representing change in characteristic wavelength of the laser light beam is supplied to a temperature controller 116-B that operates, in conjunction with a temperature control element 118-B in thermal contact with the VLD 101-B, to adjust temperature of the VLD 101-B (if need be) based upon the values of the mode switching signal 114-B supplied thereto, to thereby minimize and avoid changes in characteristic wavelength of the laser light beams.

Figure 7A:
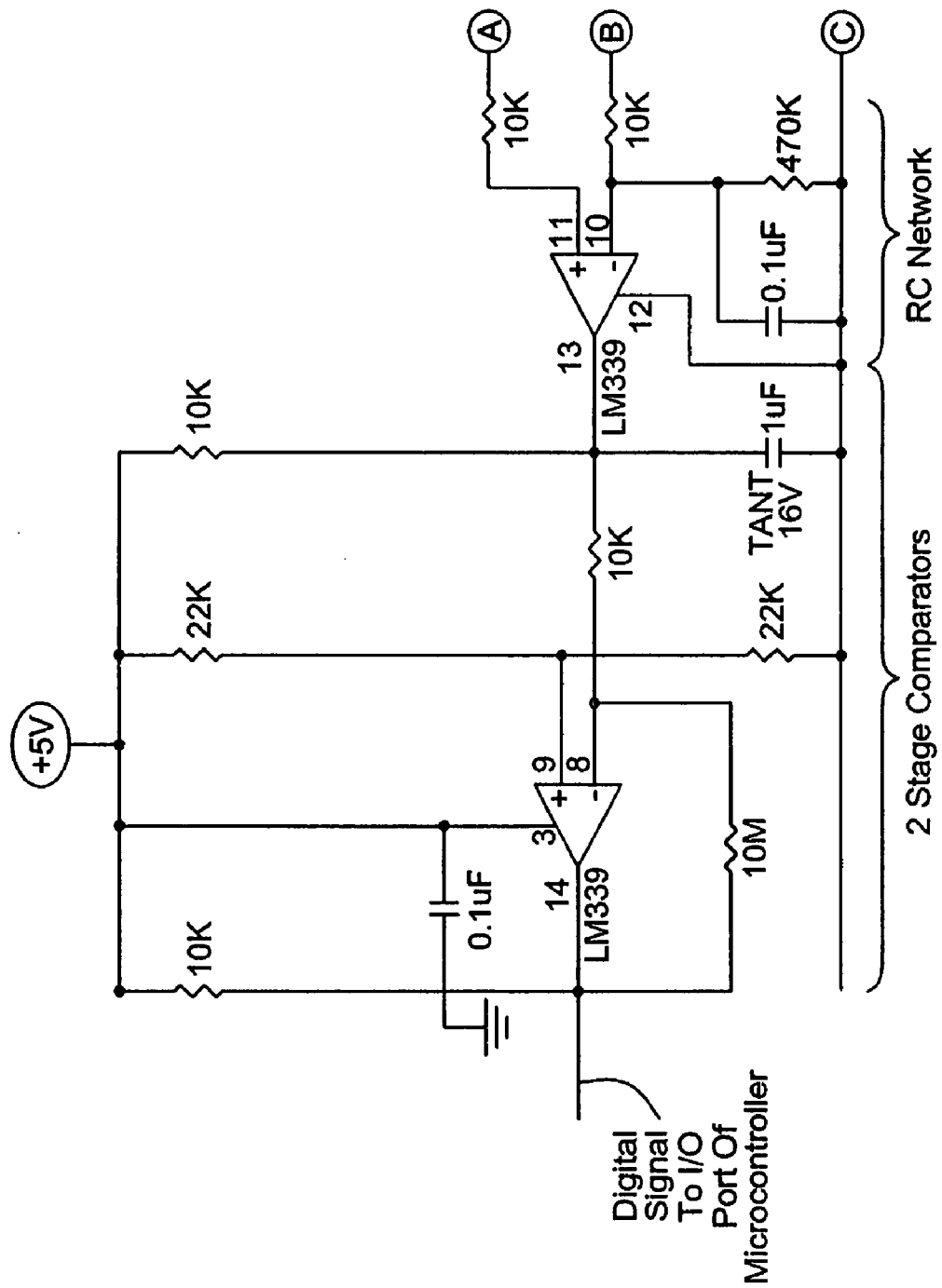

FIGS. 7(A)(i), 7(A)(ii) and 7(B) illustrate exemplary embodiments of the photodetector elements and signal processing circuitry, operably coupled thereto, for detecting mode switching of the laser light source (e.g., VLD) employed in the diffractive-based laser scanning system of the present invention;

FIGS. 8(A)-8(D)(iii)(b) illustrate exemplary control routines executed by the temperature controller of the diffractive-based laser scanning systems of the present invention in adjusting the temperature of the laser light source (e.g., VLD) employed therein based upon the values of the mode switching signal supplied thereto, to thereby minimize and avoid changes in characteristic wavelength of the laser light beams emitted from the laser light source (e.g., VLD).

DETAILED DESCRIPTION OF THE ILLUSTRATIVE EMBODIMENTS OF THE PRESENT INVENTION

Referring to the figures in the accompanying Drawings, the various illustrative embodiments of the diffractive-based laser scanning system (and components therein) of the present invention will be described in great detail, wherein like elements will be indicated using like reference numerals.

Figure 1:
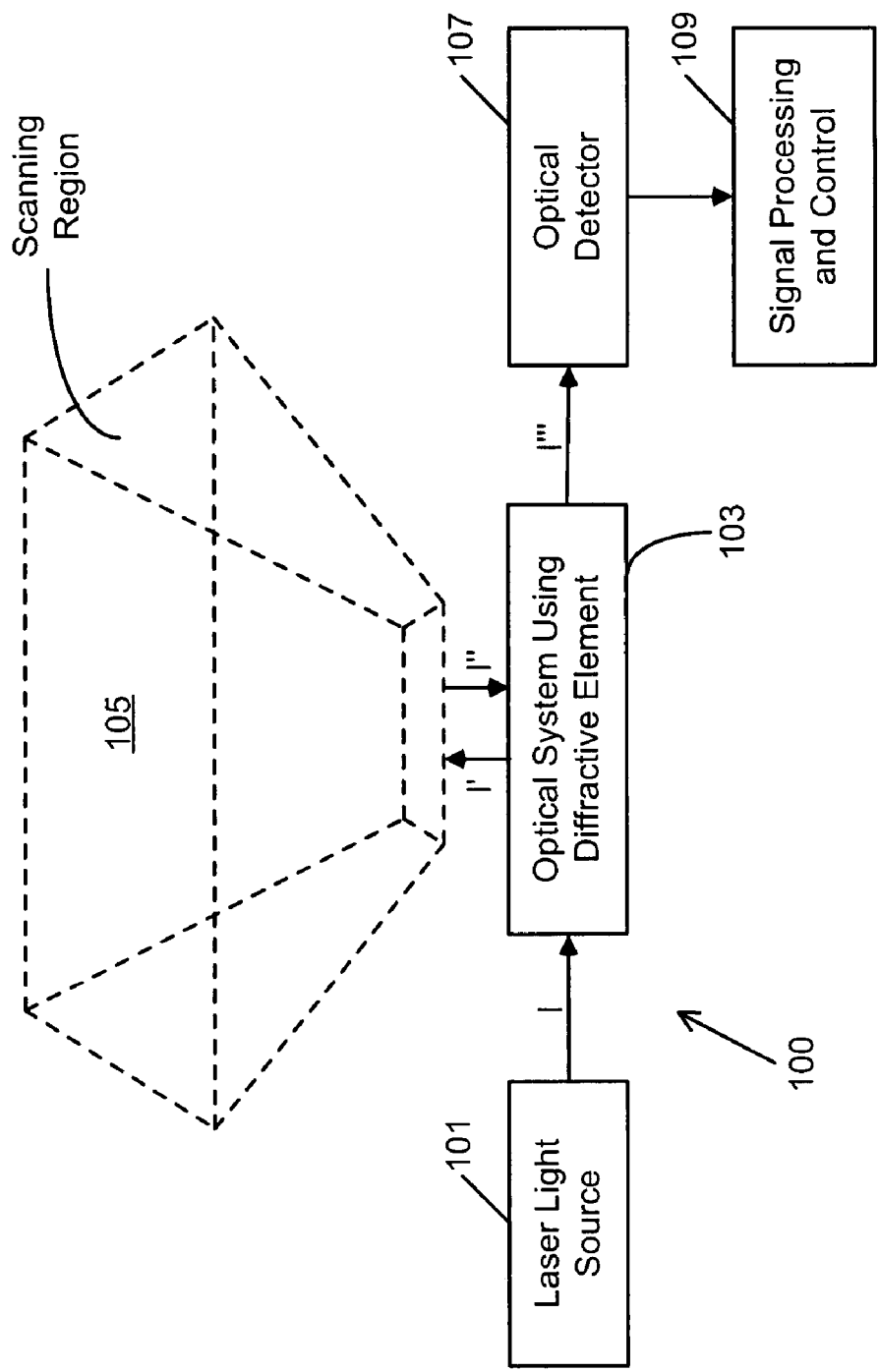
FIG. 1 is a schematic illustration of prior art diffractive-based laser scanning systems wherein a laser light source 101 (such as a solid state VLD) emits laser light beams (denoted I) having a characteristic wavelength; an optical subsystem 103 directs portions (denoted I') of these laser light beams into a scanning region 105; the returning (i.e., incoming) laser light beams (denoted I") from the scanning region 105, which reflect off light reflective surfaces in the scanning region 105, are collected by the optical subsystem 103 and portions (denoted I''') of the returning laser light beams are directed to photodetector(s) 107 and signal processing and control circuitry 109 that capture and analyze the returning laser light beam portions to identify properties (such as bar code symbols, spatial dimensions, spatial profiles, and velocity) of the surfaces within the scanning region; the optical subsystem 103 utilizes at least one diffractive optical element (DOE) in directing the laser light beams I' into the scanning region 105, collecting the returning laser light beams I", and/or directing the portions of the returning laser light beams I''' to the photodetector(s) 107.
Figure 2:
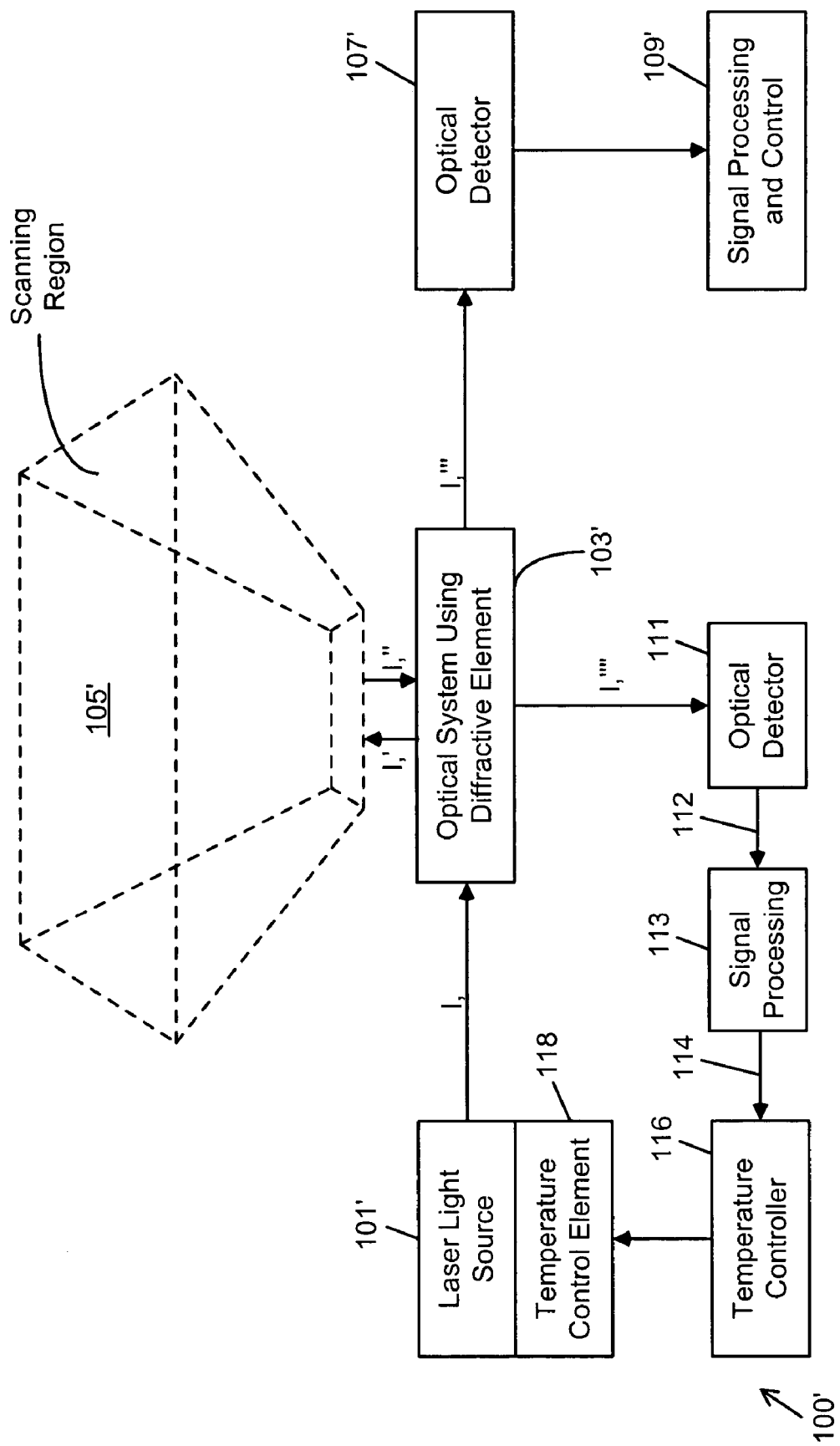
FIG. 2 is a schematic illustration of a diffractive-based laser system of the present invention including a laser light source 101' (such as a solid state VLD) that emits a laser light beam (denoted $I_1$) having a characteristic wavelength; an optical subsystem 103' directs portions (denoted $I_1'$) of this laser light beam into a scanning region 105'; the returning (i.e., incoming) laser light beams (denoted $I_1''$) from the scanning region 105', which reflect off light reflective surfaces in the scanning region 105', are collected by the optical subsystem 103 and portions (denoted $I_1'''$) of the returning laser light beams are directed to photodetector 107' and signal processing and control circuitry 109' that capture and analyze the returning laser light beam portions to identify properties (such as bar code symbols, spatial dimensions, spatial profiles, and velocity) of the surfaces within the scanning region; the optical subsystem 103' utilizes at least one diffractive optical element (DOE) in producing the laser light beam $I_1'$ directed into the scanning region 105', collecting the returning laser light beams $I_1''$, and/or directing the portions of the returning laser light beams $I_1'''$ to the photodetector 107'; in addition, the optical subsystem 103' includes at least one diffractive optical element (DOE) that directs a portion (denoted $I_1''''$) of the laser light beam $I_1$ incident on the optical subsystem 103' to photodetector 111; because the optical characteristics of the DOE(s) are sensitive to wavelength, the intensity of the light beam portion $I_1''''$ directed to the photodetector 111 characterizes the characteristic wavelength of the laser light beam $I_1$ emitted from the laser light source 101'; the photodetector 111 generates a first electrical signal 112 whose amplitude is proportional to the intensity of the laser light beam portions $I_1''''$ directed thereto by the DOE(s) of the optical subsystem 103' (and is proportional to the characteristic wavelength of the laser light beam $I_1$ emitted from the laser light source 101'); the first electrical signal 112 generated by the photodetector 111 is supplied to signal processing circuitry 113 that generates a mode switching signal 114 representing change in characteristic wavelength of the laser light beam $I_1$ emitted from the laser light source 101' based upon the first electrical signal 112; the mode switching signal 114 representing change in characteristic wavelength of the laser light beam $I_1$ is supplied to a temperature controller 116 that operates, in conjunction with a temperature control element 118 in thermal contact with the laser light source 101', to adjust temperature of the laser light source 101' (if need be) based upon the values of the mode switching signal 114 supplied thereto, to thereby minimize and avoid changes in characteristic wavelength of the laser light beam $I_1$.

As shown in FIG. 2, a diffractive-based laser system 100 of the present invention includes a laser light source 101' (such as a solid state VLD) that emits a laser light beam (denoted $I_1$) having a characteristic wavelength. An optical subsystem 103' directs portions (denoted $I_1'$) of this laser light beam into a scanning region 105'. The returning (i.e., incoming) laser light beams (denoted $I_1''$) from the scanning region 105', which reflect off light reflective surfaces in the scanning region 105', are collected by the optical subsystem 103 and portions (denoted $I_1'''$) of the returning laser light beams are directed to photodetector 107' and signal processing and control circuitry 109' that capture and analyze the returning laser light beam portions to identify properties (such as bar code symbols, spatial dimensions, spatial profiles, and velocity) of the surfaces within the scanning region.

The optical subsystem 103' utilizes at least one diffractive optical element (DOE) in producing the laser light beam $I_1'$ directed into the scanning region 105', collecting the returning laser light beams $I_1''$, and/or directing the portions of the returning laser light beams $I_1'''$ to the photodetector 107'. In addition, the optical subsystem 103' includes at least one diffractive optical element (DOE) that directs a portion (denoted $I_1'''$) of the laser light beam I1 incident on the optical subsystem 103' to photodetector 111. Because the optical characteristics of the DOE(s) are sensitive to wavelength, the intensity of the light beam portion $I_1'''$ directed to the photodetector 111 characterizes the characteristic wavelength of the laser light beam $I_1$ emitted from the laser light source 101'.

The photodetector 111 (which may be, for example, one or more photo-diodes) generate a first electrical signal 112 whose amplitude is proportional to the intensity of the laser light beam portions $I_1'''$ directed thereto by the DOE(s) of the optical subsystem 103' (and is proportional to the characteristic wavelength of the laser light beam $I_1$ emitted from the laser light source 101'). The first electrical signal 112 generated by the photodetector 111 is supplied to signal processing circuitry 113 that generates a mode switching signal 114 representing change in characteristic wavelength of the laser light beam $I_1$ emitted from the laser light source 101' based upon the first electrical signal 112. Preferably, the signal processing circuitry 113 amplifies and filters the first electrical signal 112 in order to improve the signal-to-noise ratio (SNR) of the mode switching signal 114.

The mode switching signal 114 representing change in characteristic wavelength of the laser light beam I1 is supplied to a temperature controller 116 that operates, in conjunction with a temperature control element 118 in thermal contact with the laser light source 101', to adjust temperature of the laser light source 101' (if need be) based upon the values of the mode switching signal 114 supplied thereto, to thereby minimize and avoid changes in characteristic wavelength of the laser light beam $I_1$. The temperature controller 116 is preferably implemented with a low-cost microcontroller, such as one belonging to the Microchip PIC12C5XX family.

Preferably, the temperature control element 118 includes a passive cooling element (such as a heat sink that dissipates heat to ambient air) and an active heating element (such as a heating resistor or other active heating element affixed to the heat sink) placed in thermal contact with the laser light source 101'. In this preferred embodiment, the temperature controller 116 increases temperature (i.e., heats) the laser light source 101' by applying (or increasing) power supplied to the active heating element, and decreases temperature (i.e., cools) the laser light source 101' by cutting-off (or decreasing) power supplied to the active heating element (thereby allowing the passive cooling element to cool the laser light source 101').

In an alternate embodiment, the temperature control element may be a thermoelectric module (sometimes referred to as a Peltier device), in thermal contact with the laser light source 101' that is capable of heating and cooling the laser light source 101' under control of the temperature controller 116.

Figure 3A:
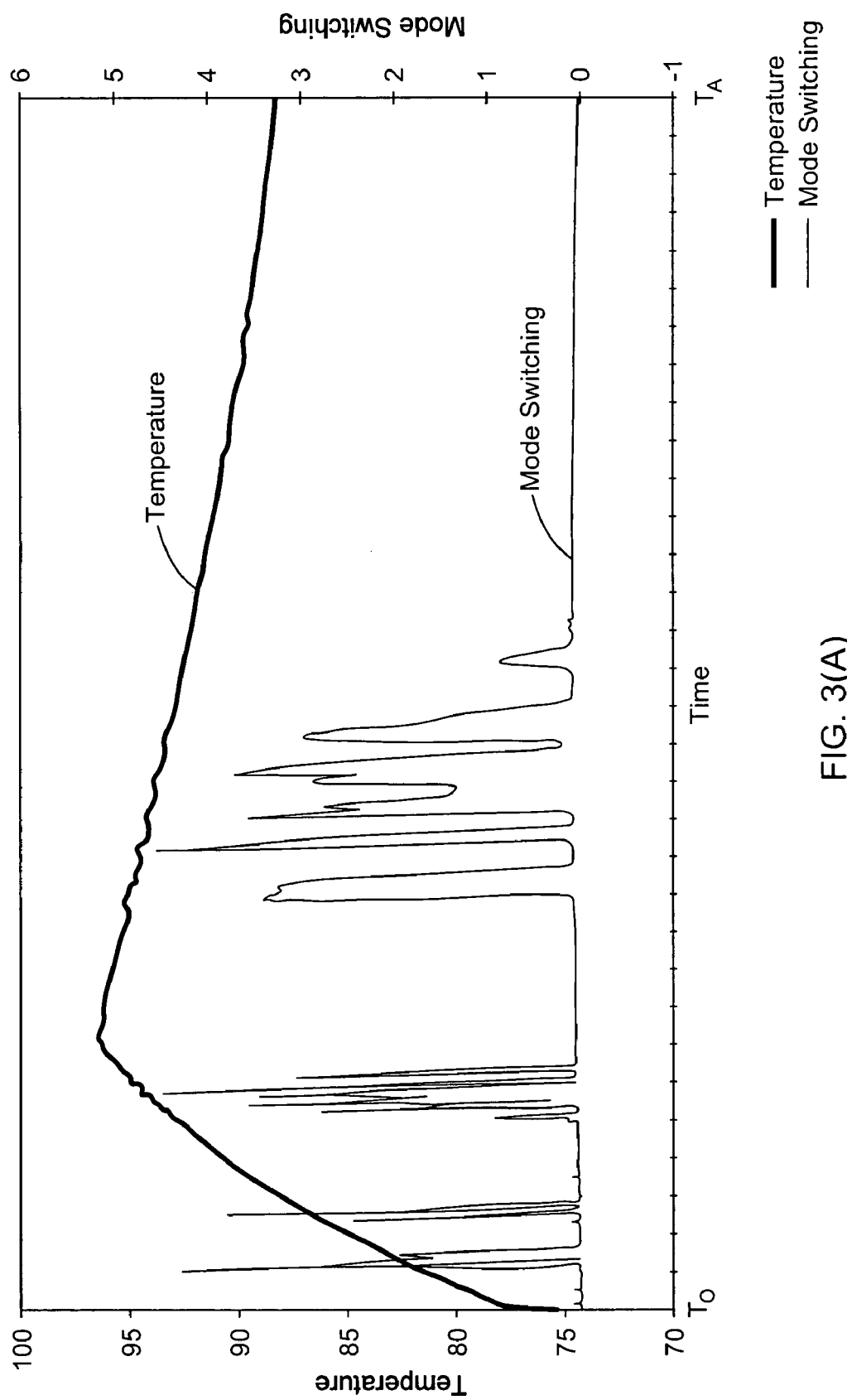
FIGS. 3(A)-(B) and 4(A)-(B) are plots of experimental data that illustrate the operation (and resulting benefits) of the improved diffractive-based laser scanning system 100 of the present invention.
Figure 3B:
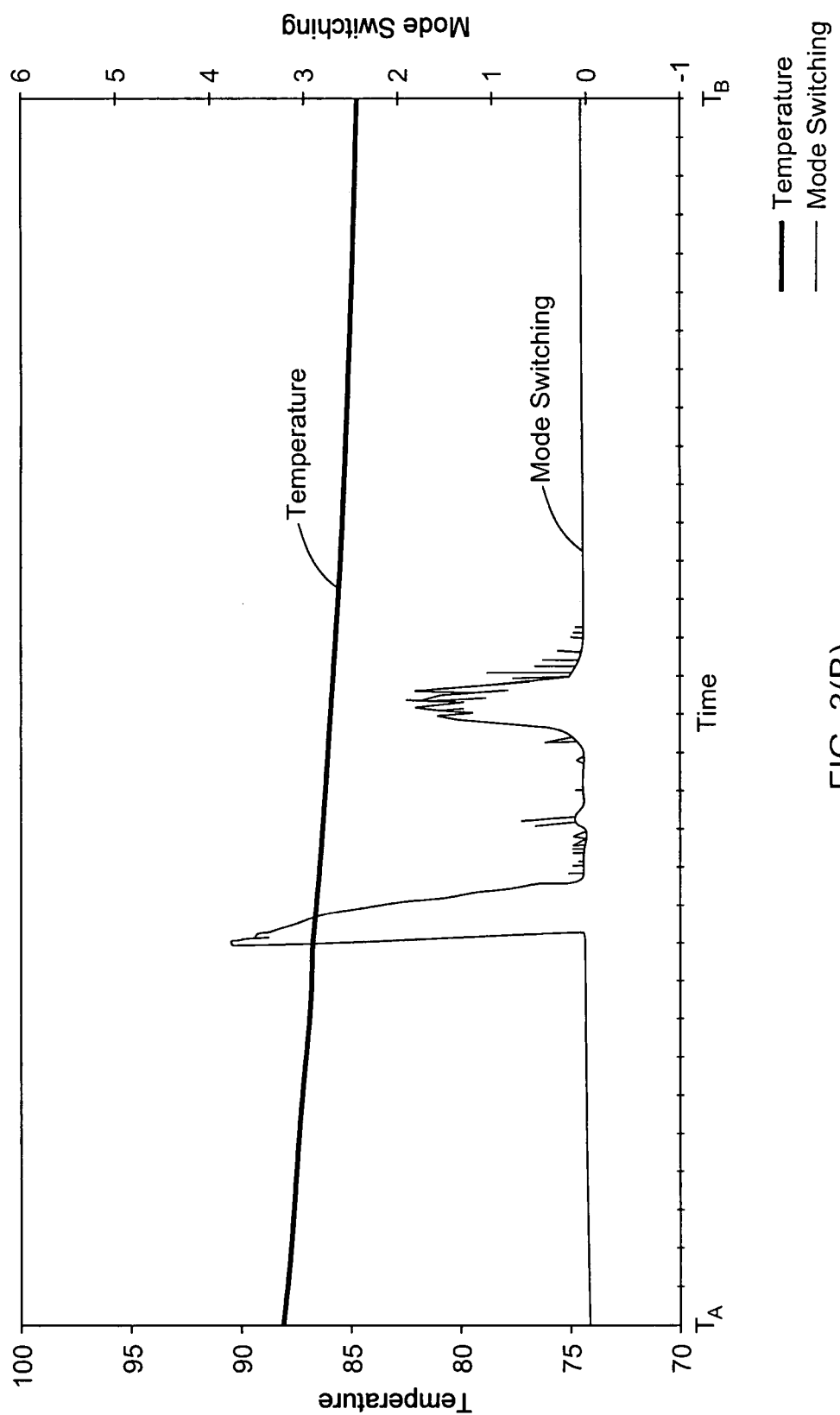
Figure 4A:
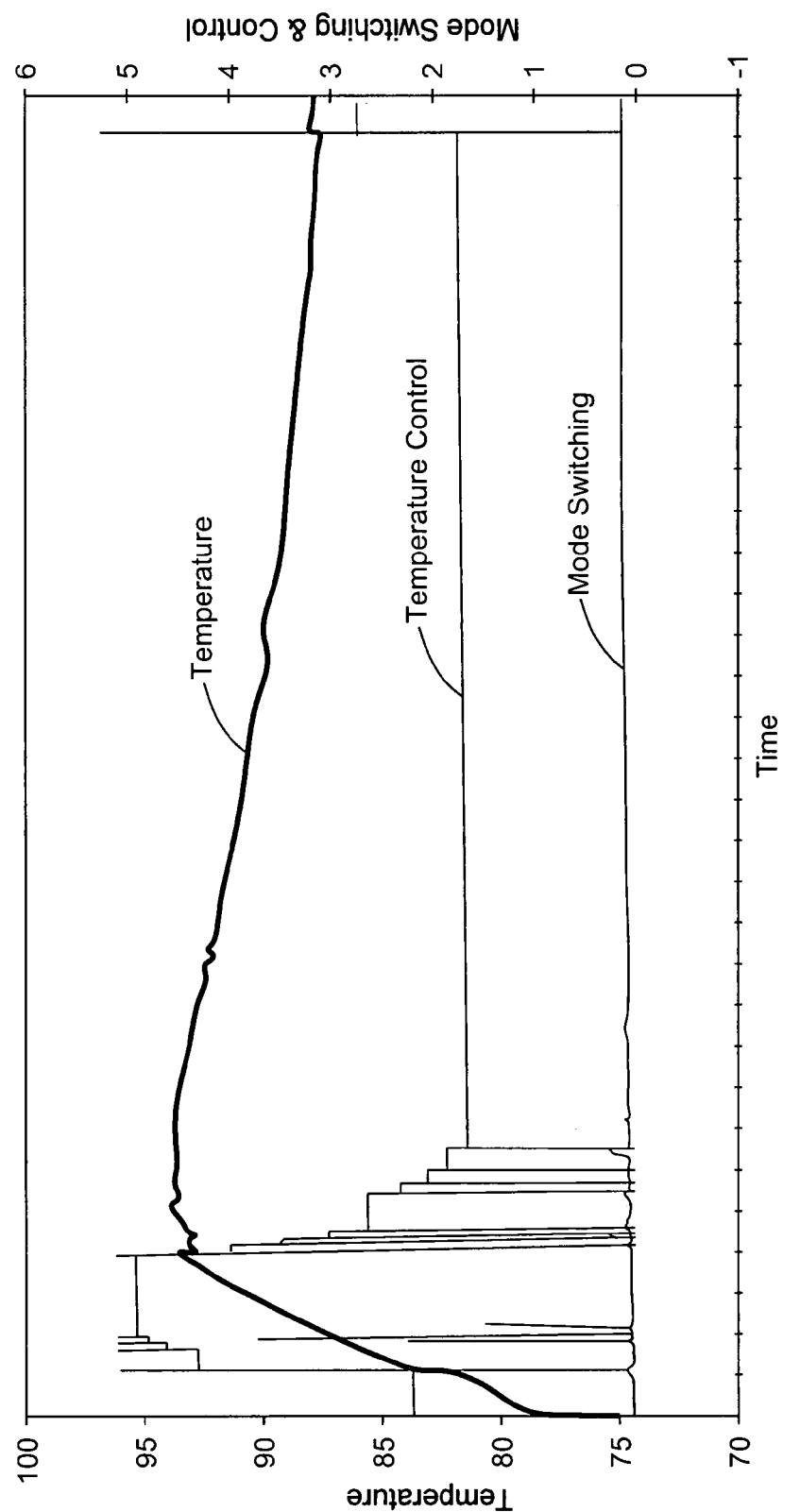
Figure 4B:
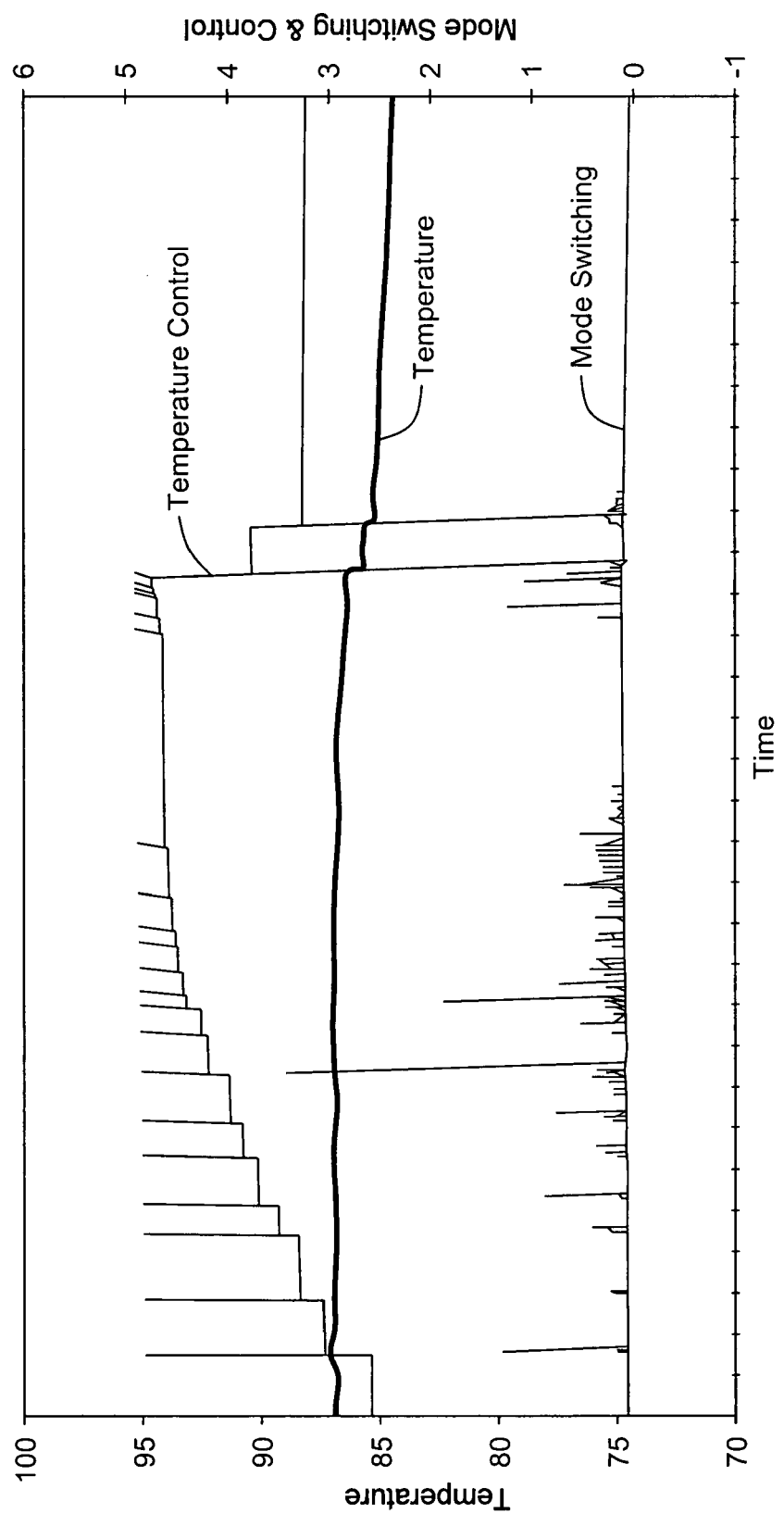

FIGS. 3(A)-(B) and 4(A)-(B) are plots of experimental data that illustrate the operation (and resulting benefits) of the improved diffractive-based laser scanning system 100' of the present invention. FIGS. 3(A)-(B) illustrate the open-loop operation of the system 100' (wherein the temperature controller is not operational), thereby depicting the problems addressed by the closed-loop operation of the system 100' (wherein the temperature controller is operational) as illustrated in FIGS. 4(A)-(B).

More specifically, FIGS. 3(A)-(B) is a plot of the change in characteristic wavelength of light emitted from the laser light source 101' (represented by the "mode switching" signal generated by the signal processing circuitry 113 of FIG. 2) as temperature of the diffractive-based laser scanning system 100', and the laser light source 101' embodied therein (represented by the "temperature" signal) varies over time. Note that changes in the characteristic wavelength of light emitted from the laser light source 101' occur sporadically as the temperature varies over time. Such wavelength changes are due to mode switching of the laser light source, and can potentially cause unwanted variations in the amplitude and direction of light directed through the scanning region 105', as well as unwanted variations in cross-sectional dimensions and beam shape of the laser scanning beams. If such variations are significant, light beams entering the scanning region 105' may not move uniformly through the scanning region 105', instead jumping rapidly about its expected position. This results in an effectively larger "spot" size of the light beam at its focal point in the scanning region 105', which may lead to unwanted distortion and signal processing errors, for example, errors in the resolution of the bars and spaces of scanned code symbols and, often, intolerable symbol decoding errors.

FIGS. 4(A) and (B) is a plot of the change in characteristic wavelength of light emitted from the laser light source 101' (represented by the "mode switching" signal generated by the signal processing circuitry 113 of FIG. 2) as temperature of the diffractive-based laser scanning system 100', and the laser light source 101' embodied therein (represented by the "temperature" signal) varies over time. In addition, FIGS. 4(A)-(B) depicts an exemplary temperature control signal that is generated by the temperature controller 116 in response to the values of the mode switching signal supplied thereto over time. The temperature control signal is supplied to the temperature control element 118 to selectively heat (or cool) the laser light source 101', to thereby minimize and avoid changes in characteristic wavelength of the laser light beam emitted from the laser light source 101'. Note that changes in the characteristic wavelength of light emitted from the laser light source 101' still occur sporadically as the temperature varies over time; however, the duration of the time periods in which such wavelength changes occur is significantly decreased, thereby mitigating any potential problems caused by such wavelength changes (for example, unwanted distortion and signal processing errors as described above).

The diffractive-based laser scanning system 100' of the present invention may be a holographic laser scanning system that utilizes one or more multi-faceted holographic optical elements to direct the outgoing laser light through the scanning region 105' and collect the incoming laser light for capture by the optical detector(s) 107'. An exemplary holographic laser scanning system 100-A of the present invention is illustrated in detail in FIGS. 5(A)-(G), which produces a 3-D laser scanning region. The 3-D laser scanning region contains an omnidirectional laser scanning pattern having five over-lapping focal zones which are formed by five laser scanning stations indicated as LS1, LS2, LS3, LS4 and LS5 in FIG. 5(A), arranged about a sixteen-facet holographic scanning disc 130 (illustrated in greater detail in FIG. 5(D)). The scanning pattern projected within the middle (third) focal plane of the holographic laser scanning system is shown in FIG. 5(F).

In general, the scan pattern and scan speeds for the holographic laser scanning system can be designed and constructed using the methods detailed in U.S. Pat. Nos. 6,158, 659, 6,085,978, 6,073,846, and 5,984,185, all commonly assigned to the assignee of the present invention and each herein incorporated by reference in their entirety. The design parameters for each sixteen facet holographic scanning disc shown in FIG. 5(D), and the supporting subsystems used therewith, are set forth in detail in the above-referenced U.S. patents.

Figure 5A:
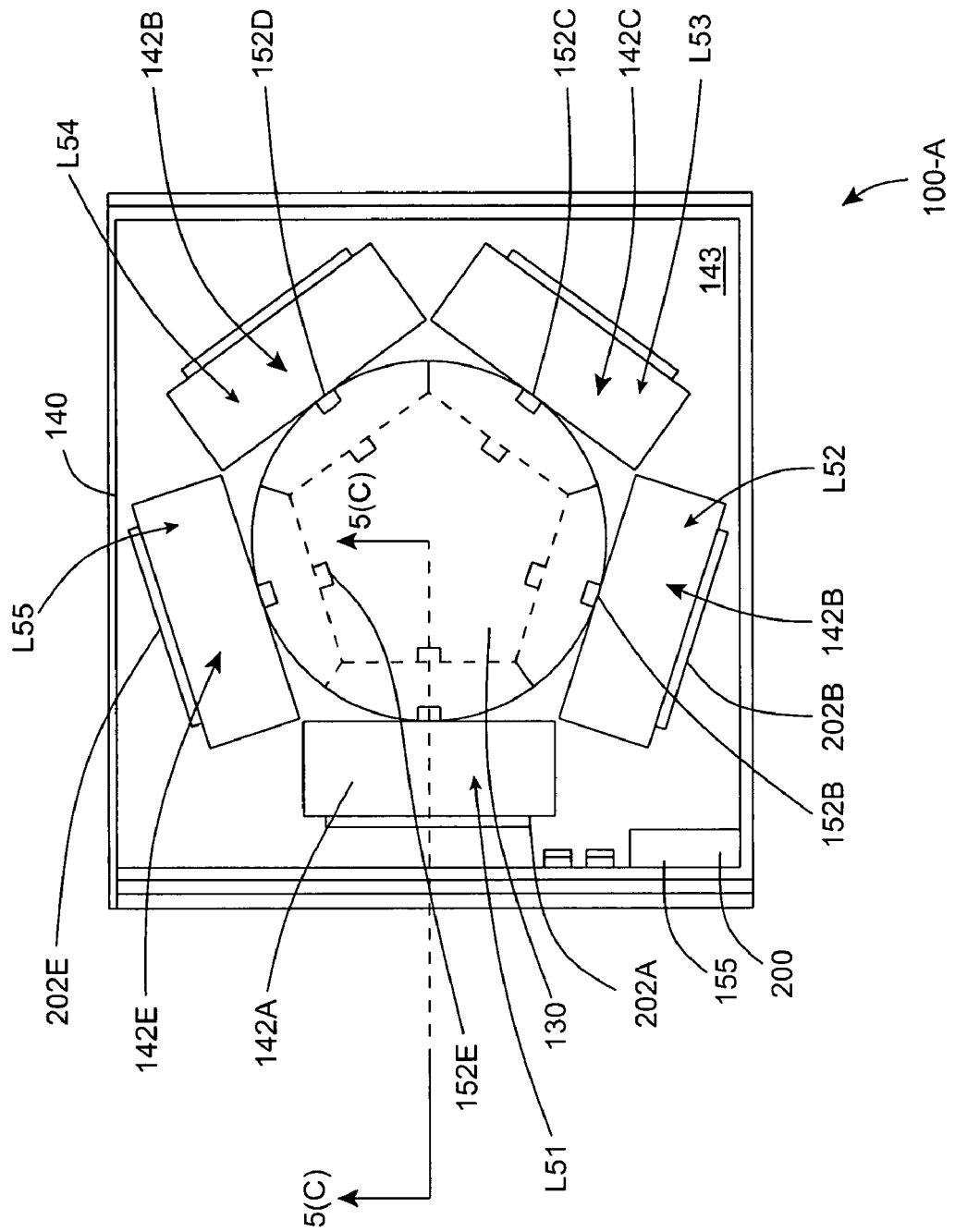
FIG. 5(A) is a schematic illustration of a top view of an exemplary holographic laser scanning system 100-A of the present invention, which produces an omnidirectional laser scanning pattern having five over-lapping focal zones which are formed by five laser scanning stations indicated as LS1, LS2, LS3, LS4 and LS5 arranged about a sixteen-facet holographic scanning disc 130.

As described in WIPO patent application Publication No. WO 98/22945, the holographic laser scanning system 100-A employed herein cyclically generates from its compact scanner housing 140 shown in FIG. 5A, a complex three-dimensional laser scanning pattern within a well defined 3-D scanning region. In this illustrative embodiment, each such laser scanning pattern is generated by a rotating holographic scanning disc 130, about which are mounted five (5) independent laser scanning stations, sometime referred to as laser scanning modules by Applicants. In FIG. 5(A), these laser scanning stations are indicated by LS1, LS2, LS3, LS4 and LS5.

Figure 5B:
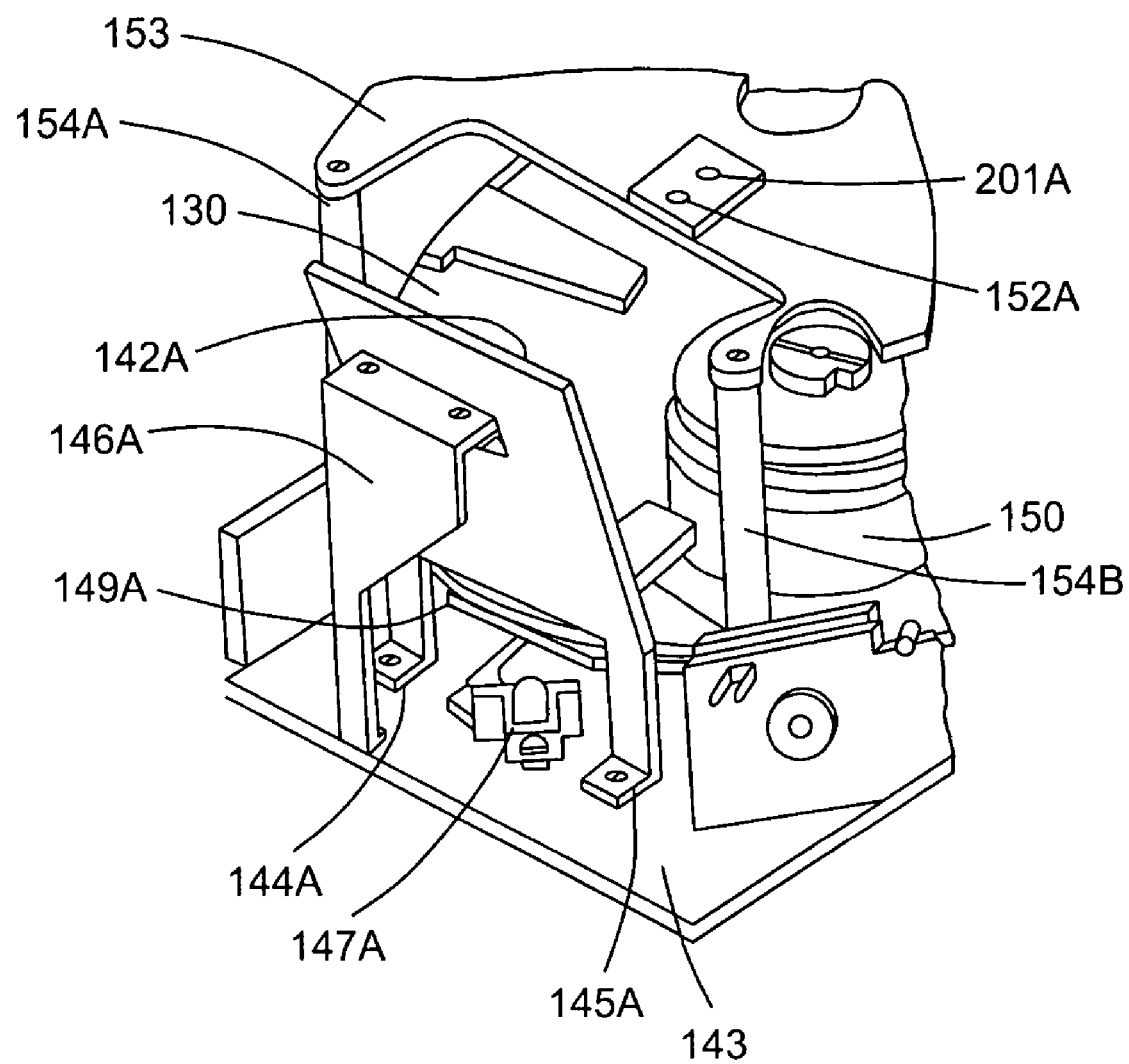
FIG. 5(B) is a schematic illustration of one (LS1) of the laser scanning stations of the holographic laser scanning system 100-A of the present invention as illustrated in FIG. 5(A) including a laser beam production module 147A mounted on an optical bench; a beam folding mirror 142A associated with the laser scanning station L1, has a substantially planar reflective surface and is tangentially mounted adjacent to the holographic scanning disc 130.

In FIG. 5(B), one of the laser scanning stations in the holographic scanning system 100-A is shown in greater detail. For illustration purposes, all subcomponents associated therewith shall be referenced with the character "A", whereas the subcomponents associated with the other four laser scanning stations shall be referenced using the characters B through E. As illustrated in FIG. 5(B), a beam folding mirror 142A associated with the laser scanning station L1, has a substantially planar reflective surface and is tangentially mounted adjacent to the holographic scanning disc 130. In the illustrative embodiment, beam folding mirror 142A is supported in this position relative to the housing base (i.e. the optical bench) 143 using support legs 144A and 145A and rear support bracket 146A.

As shown in FIG. 5(B), the laser scanning station L1 includes a laser beam production module 147A mounted on the optical bench (i.e. housing base plate 143). The laser beam production module 147A is preferably mounted on the optical bench 143 immediately beneath its associated beam folding mirror 142A.

As shown in FIGS. 5(A), the five laser production modules 142A through 142E are mounted on base plate 143, substantially but not exactly symmetrically about the axis of rotation of the shaft of electric motor 150. During laser scanning operations, these laser beam production modules produce 5 independent laser beams which are directed through the edge of the holographic disc 130 at an angle of incidence $A_i$, which, owing to the symmetry of the laser scanning pattern of the illustrative embodiment, is the same for each laser scanning station (i.e. $A_i$=43.0 degrees for all values of i). The incident laser beams produced from the 5 laser beam production modules 142A through 142E extend along the five central reference planes, each extending normal to the plane of base plate 143 and arranged about 72 degrees apart from its adjacent neighboring central planes. While these central reference planes are not real (i.e. are merely virtual), they are useful in describing the geometrical structure of each laser scanning station in the holographic laser scanning system 100-A of the present invention.

The facets of rotating the scanning disk 130 diffract the incident light beams (produced from the laser beam production modules 147A . . . 147E) and directs the diffracted light beams onto the associated light bending mirrors 142A . . . 142E, which directs the diffracted light beams through the scanning region, thereby producing a 3-D omnidirectional scanning pattern. The middle (third) focal plane of this omnidirectional scanning pattern is shown in FIG. 5(F).

As shown in FIG. 5(B), the laser scanning station L1 includes at least one photodetector (e.g. a silicon photocell) 152A mounted along its central reference plane, above the holographic disc 130 and opposite its associated beam folding mirror 142A so that it does not block or otherwise interfere with the returning (i.e. incoming) laser light rays reflecting off light reflective surfaces (e.g. product surfaces, bar code symbols, etc) during laser scanning and light collecting operations.

In the illustrative embodiment, the photodetectors 152A through 152E are supported in their respective positions by a photodetector support frame 153, which is stationarily mounted to the optical bench by way of vertically extending support elements (two shown as 154A and 154B). The electrical analog scan data signal produced from each photodetector 152A through 152E is processed in a conventional manner by its analog scan data signal processing circuitry 201A through 201E, which may be supported upon the photodetector support frame as shown. The analog scan data signal processing circuitry 201A may be realized as an Application Specific Integrated Circuit (ASIC) chip, which is suitably mounted with the photodetector 152A onto a small printed circuit (PC) board, along with electrical connectors which allow for interfacing with other boards within the scanner housing. With all of its components mounted thereon, each PC board may be suitably fastened to the photodetector support frame 153, along its respective central reference frame, as shown in FIG. 5(B).

Notably, the height of the photodetector support frame 153, referenced to the base plate (i.e. optical bench), is chosen to be less than the minimum height so that the beam folding mirrors must extend above the holographic disc in order to realize the prespecified laser scanning pattern of the illustrative embodiment. In practice, this height parameter is not selected (i.e. specified) until after the holographic disc has been completely designed according to the design process of the present invention, while satisfying the design constraints imposed on the disc design process. As explained in detail in WIPO Publication No. WO 98/22945, the use of a spreadsheet-type computer program to analytically model the geometrical structure of both the laser scanning apparatus and the ray optics of the laser beam scanning process, allows the designer to determine the geometrical parameters associated with the holographic scanning facets on the disc which, given the specified maximum height of the beam folding mirrors $Y_j$, will produce the prespecified laser scanning pattern (including focal plane resolution) while maximizing the use of the available light collecting area on the holographic scanning disc.

Figure 5C:
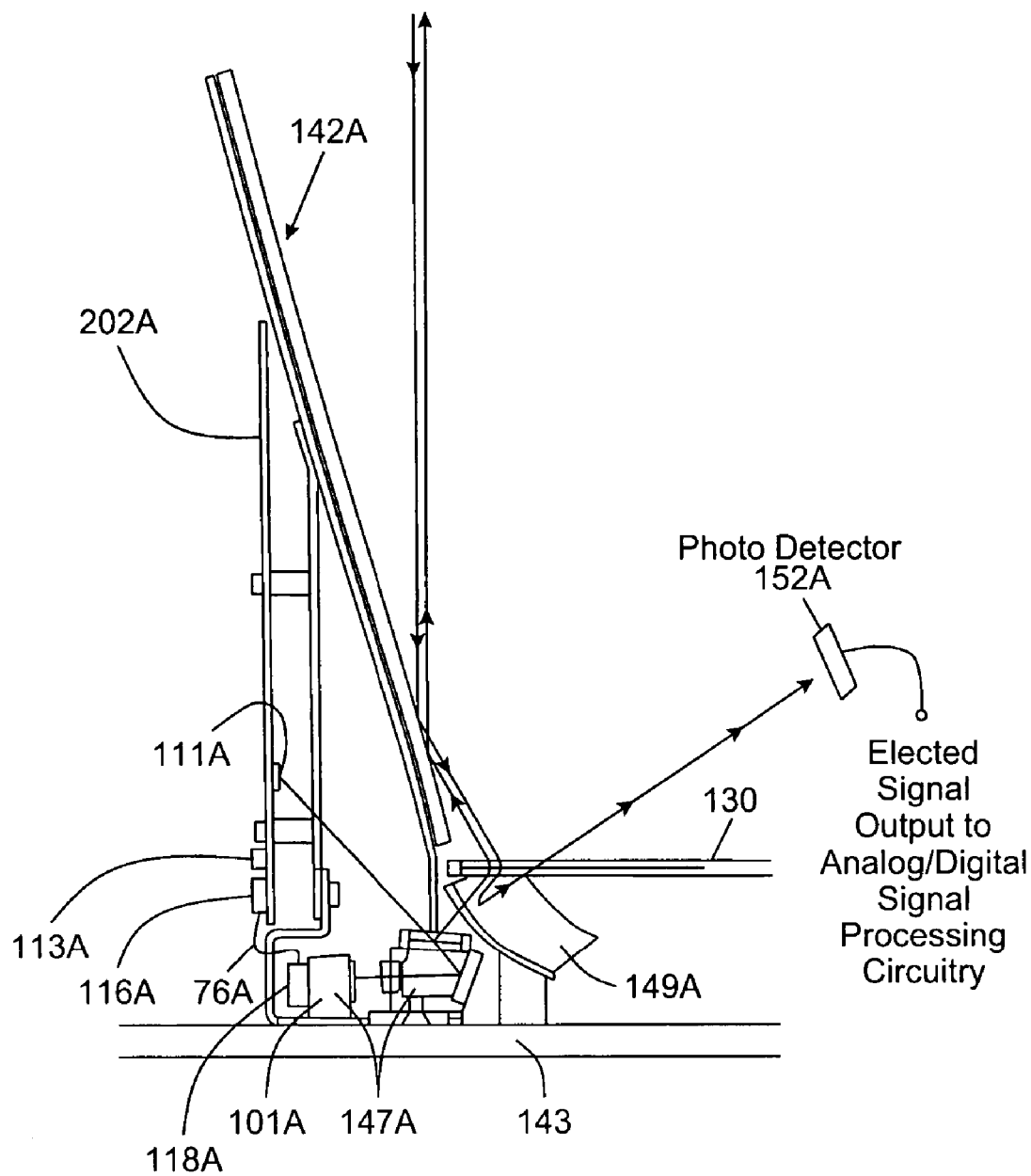
FIG. 5(C) is a schematic illustration of a cross-section of the holographic laser scanning system 100-A of the present invention as illustrated in FIGS. 5(A) and 5(B) wherein facets of rotating the scanning disk 130 diffract incident light beams (produced from the laser beam production module 147A) and directs the diffracted light beams onto the associated light bending mirrors 142A, which directs the diffracted light beams through the scanning region, thereby producing a 3-D omnidirectional scanning pattern; at least one photodetector (e.g. a silicon photocell) 152A is mounted along the central reference plane of the laser scanning station LS1, above the holographic disc 130 and opposite its associated beam folding mirror 142A so that it does not block or otherwise interfere with the returning (i.e. incoming) laser light rays reflecting off light reflective surfaces (e.g. product surfaces, bar code symbols, etc) during laser scanning and light collecting operations; the electrical analog scan data signal produced from the photodetector 152A (and other photodetectors 152B ... 152E) is processed in a conventional manner by its analog scan data signal processing circuitry 201A through 201E; the parabolic light collecting mirror 149A of the laser scanning station L1 is disposed beneath the holographic scanning disc 130, along the central reference plane associated with the laser scanning station LS1; the light collecting mirror 149A collects incoming light rays reflected off an object (e.g. surface, or bar code symbol affixed thereto) and passing through the holographic facet (producing the corresponding instant scanning beam) onto to the parabolic light collecting mirror 149A; and focuses such collected light rays through the same holographic facet onto the photodetector associated with the laser scanning station; a photodetector 111A is supported within the housing 143 of the holographic laser scanning system such that it intercepts the zeroth diffraction order laser beam transmitted from a diffractive optical element of the laser beam production module 147A; the photodetector 111A produces a first electrical signal 112A indicative of the detected intensity the zeroth diffraction order laser beam emitted from the diffractive optical element; the first electrical signal 112 generated by the photodetector 111A is supplied to signal processing circuitry 113A that generates a mode switching signal 114A representing change in characteristic wavelength of the laser light beam emitted from the VLD 101A based upon the first electrical signal 112; the mode switching signal 114A representing change in characteristic wavelength of the laser light beam is supplied to a temperature controller 116A that operates, in conjunction with a temperature control element 118A in thermal contact with the VLD 101A, to adjust temperature of the VLD 101A (if need be) based upon the values of the mode switching signal 114A supplied thereto, to thereby minimize and avoid changes in characteristic wavelength of the laser light beams.

As best shown in FIG. 5(C), the parabolic light collecting mirror 149A of the laser scanning station L1 is disposed beneath the holographic scanning disc 130, along the central reference plane associated with the laser scanning station. While certainly not apparent from this figure, precise placement of the parabolic light collecting element (e.g. mirror) 149A relative to the holographic facets on the scanning disc 130 is a critical requirement for effective light detection by the photodetector (152A) associated with each laser scanning station L1. Placement of the photodetector 152A at the focal point of the parabolic light focusing mirror alone is not sufficient for optimal light detection in the light detection subsystem of the present invention. As taught in WIPO Publication No. WO 98/22945, careful analysis must be accorded to the light diffraction efficiency of the holographic facets on the scanning disc and to the polarization state(s) of collected and focused light rays being transmitted therethrough for detection. As will become more apparent hereinafter, the purpose of such light diffraction efficiency analysis ensures the realization of two important conditions, namely: (i) that substantially all of the incoming light rays reflected off an object (e.g. surface, or bar code symbol affixed thereto) and passing through the holographic facet (producing the corresponding instant scanning beam) are collected by the parabolic light collecting mirror 149A; and (ii) that all of the light rays collected by the parabolic light collecting mirror 149A are focused through the same holographic facet onto the photodetector associated with the station, with minimal loss associated with light diffraction and refractive scattering within the holographic facet. A detailed procedure is described in WIPO Publication No. WO 98/22945 for designing and installing the parabolic light collecting mirror 149A in order to satisfy the operating conditions for effective light collection and detection as described above.

The optical scan data signal $D_0$ focused onto the photodetector 152A during laser scanning operations is produced by light rays of a particular polarization state (e.g., S polarization state) associated with a diffracted laser beam being scanned across a light reflective surface (e.g. the bars and spaces of a bar code symbol) and scattering thereof. Typically, the polarization state distribution of the scattered light rays is altered when the scanned surface exhibits diffuse reflective characteristics. Thereafter, a portion of the scattered light rays are reflected along the same outgoing light ray paths toward the holographic facet(s) on the scanning disc 130 which produced the scanned laser beam. These reflected light rays are collected by these facet(s) and ultimately focused onto the photodetector 152A by its parabolic light reflecting mirror 149A disposed beneath the scanning disc 130. The function of each photodetector 152A is to detect variations in the amplitude (i.e. intensity) of optical scan data signal $D_0$, and to produce in response thereto an electrical analog scan data signal $D_1$ which corresponds to such intensity variations. When a photodetector with suitable light sensitivity characteristics is used, the amplitude variations of electrical analog scan data signal $D_0$ will linearly correspond to the light reflection characteristics of the scanned surface (e.g. the scanned bar code symbol). The function of the analog signal processing circuitry 201A is to filter and amplify the electrical analog scan data signal $D_0$, in order to improve the signal-to-noise ratio (SNR) of the signal $D_1$ for output to digital signal processing circuitry, which is preferably mounted on PC board 202A that is disposed behind the beam folding mirror 142A of the laser scanning station L1 as shown in FIG. 5(C).

The digital signal processing circuitry, which is preferably mounted on the PC board 202A as shown in FIG. 5(C), preferably operates to convert the analog scan data signal $D_1$ output by the analog signal processing circuitry into a corresponding digital scan data signal $D_2$, and processes the digital scan data signal $D_2$ to extract information (such as symbols or bar codes) related to surfaces of objects passing through the scanning region based upon the characteristics of the reflected light encoded by the digital scan data signal $D_2$.

The digital signal processing circuitry preferably includes A/D conversion circuitry that converts the analog scan data signal $D_1$ output by the analog signal processing circuitry into a corresponding digital scan data signal $D_2$ having first and second (i.e. binary) signal levels which correspond to the bars and spaces of the bar code symbol being scanned. Preferably, the A/D conversion circuitry performs a shareholding function on a second-derivative zero-crossing signal in generating the digital scan data signal $D_2$. In practice, the digital scan data signal $D_2$ appears as a pulse-width modulated type signal as the first and second signal levels thereof vary in proportion to the width of bars and spaces in the scanned bar code symbol.

In addition, the digital signal processing circuitry includes digitizing circuitry whose functions are two-fold:
 (1) to convert the digital scan data signal $D_2$, associated with each scanned bar code symbol, into a corresponding sequence of digital words (i.e. a sequence of digital count values) $D_3$ representative of package identification (I.D.) data; and
 (2) to correlate time-based (or position-based) information about the facet sector on the scanning disc 130 that generated the sequence digital words $D_3$ (corresponding to a scan line or portion thereof).

Notably, in the digital word $D_3$, each digital word represents the time length duration of first or second signal level in the corresponding digital scan data signal $D_2$. Preferably, the digital words $D_3$ are in a digital format suitable for use in carrying out various symbol decoding operations which, like the scanning pattern and volume of the present invention, will be determined primarily by the particular scanning application at hand.

In addition, the digital signal processing circuitry includes symbol decoding circuitry that primarily functions to receive the digital word sequence $D_3$ produced from its respective digitizing circuitry, and subject it to one or more bar code symbol decoding algorithms in order to determine which bar code symbol is indicated (i.e. represented) by the digital word sequence $D_3$.

Reference is made to U.S. Pat. No. 5,343,027 to Knowles, herein incorporated by reference in its entirety, as it provides technical details regarding the design and construction of circuitry suitable for use in the holographic laser scanning system 100-A of the present invention.

In addition, the digital signal processing circuitry may generate information that specifies a vector-based geometric model of the laser scanning beam (and possibly plane-sector) that was used to collect the scan data underlying the decode bar code symbol. Such information may be used with "3-D ray tracing techniques" to derive the position of the decoded bar code symbol in the 3-D scanning region as described in detail in co-pending U.S. patent application Ser. No. 09/157,778, filed Sep. 21, 1998 (Attorney Docket No. 108-035USA000), co-pending U.S. patent application Ser. No. 09/327,756 filed Jun. 7, 1999 (Attorney Docket No. 108-068USA000) and International Application PCT/US00/15624, filed Jun. 7, 2000, (Attorney Docket No. 108-085PCT000), all commonly assigned to the assignee of the present invention and herein incorporated by reference in their entirety.

FIG. 5(E)(i) and 5(E)(ii) illustrate an exemplary embodiment of the laser production modules 147A of FIGS. 5(B) and 5(C) including: a visible laser diode (VLD) 101A, an aspheric collimating lens 51 supported within the bore of a housing 53 mounted upon the optical bench 143 of the module housing for collimating the laser light produced by the VLD 101A; a mirror 55, supported within the housing 53, for directing the collimated laser light produced by lens 51 to a multi-function light diffractive grating 57 (sometimes referred to by Applicants as "multi-function HOE" or "multi-function plate") supported by the housing 53. The multi-function light diffractive grating 57, having a fixed spatial frequency and disposed at incident angle relative to the outgoing laser beam provided by the mirror 55, produces a primary beam that is directed toward the facets of the rotating scanning disk 130 and a zeroth diffraction order beam (whose intensity is relatively weak compared to the intensity of the primary beam output therefrom). The multi-function light diffractive grating 57 changes the properties of the incident laser beam so that the aspect ratio of the primary beam is controlled, and beam dispersion is minimized upon the primary laser beam exiting the holographic scanning disc 130. Details for designing the multi-function light diffractive grating 57 and configuring the laser scanning beam module 147A of the illustrative embodiment is described in great detail in Applicants' prior U.S. patent application Ser. No. 08/949,915 filed Oct. 14, 1997, and incorporated herein by reference, incorporated herein by reference in its entirety.

In addition, the holographic laser scanning system 100-A includes laser drive circuitry (not shown) which generates the electrical signals for driving the VLD 101A of the respective laser beam production modules 147A, 147B, . . . 147E. The laser drive circuitry for a respective VLD may be disposed on the PC board 202 (shown in FIG. 5(C) as PC board 202A for the VLD 101A in laser beam production module 147A).

Figure 5D:
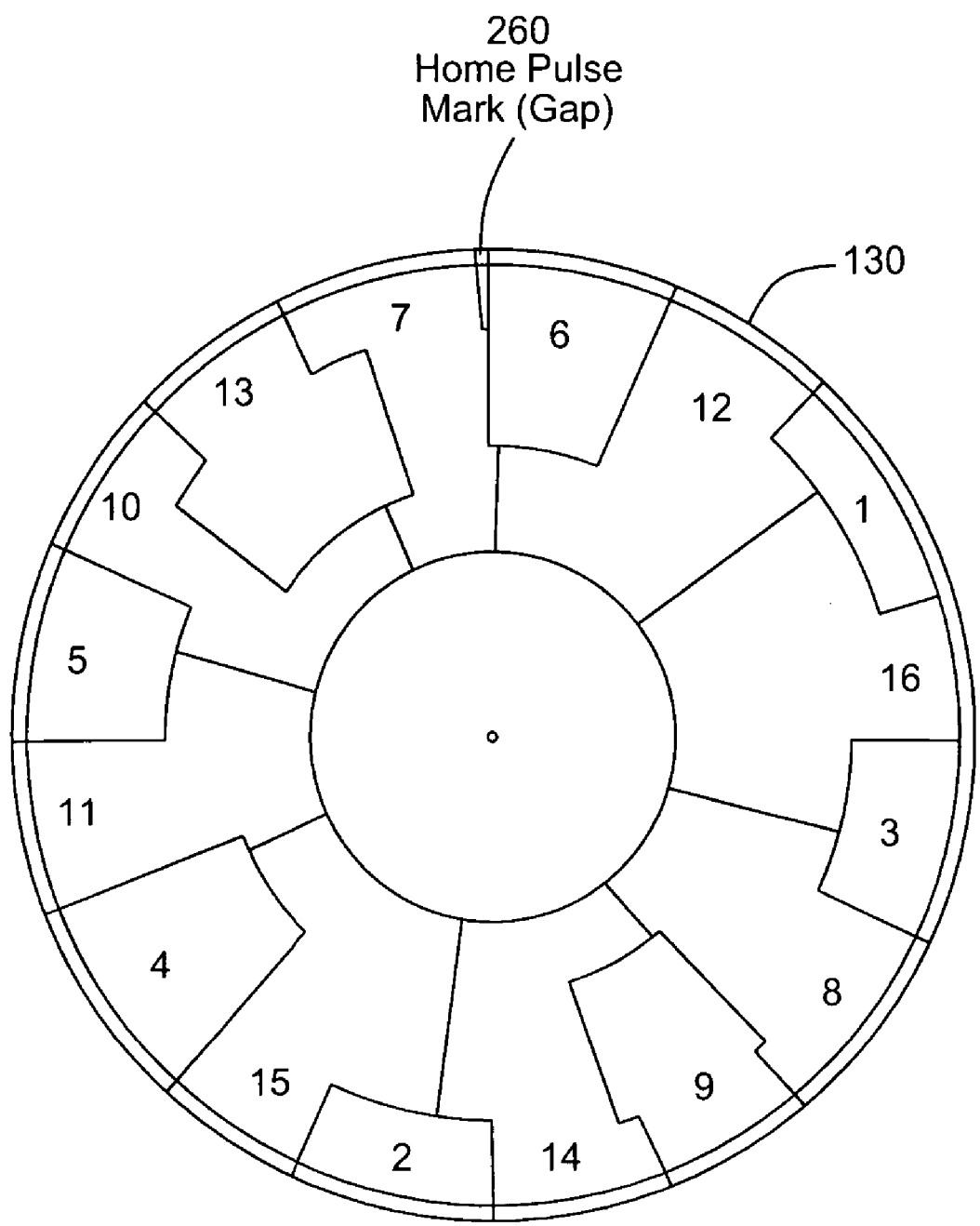
FIG. 5(D) is a schematic illustration of the scanning disk 130 of the holographic laser scanning system 100-A of the present invention as illustrated in FIGS. 5(A), 5(B) and 5(C).
Figure 5F:
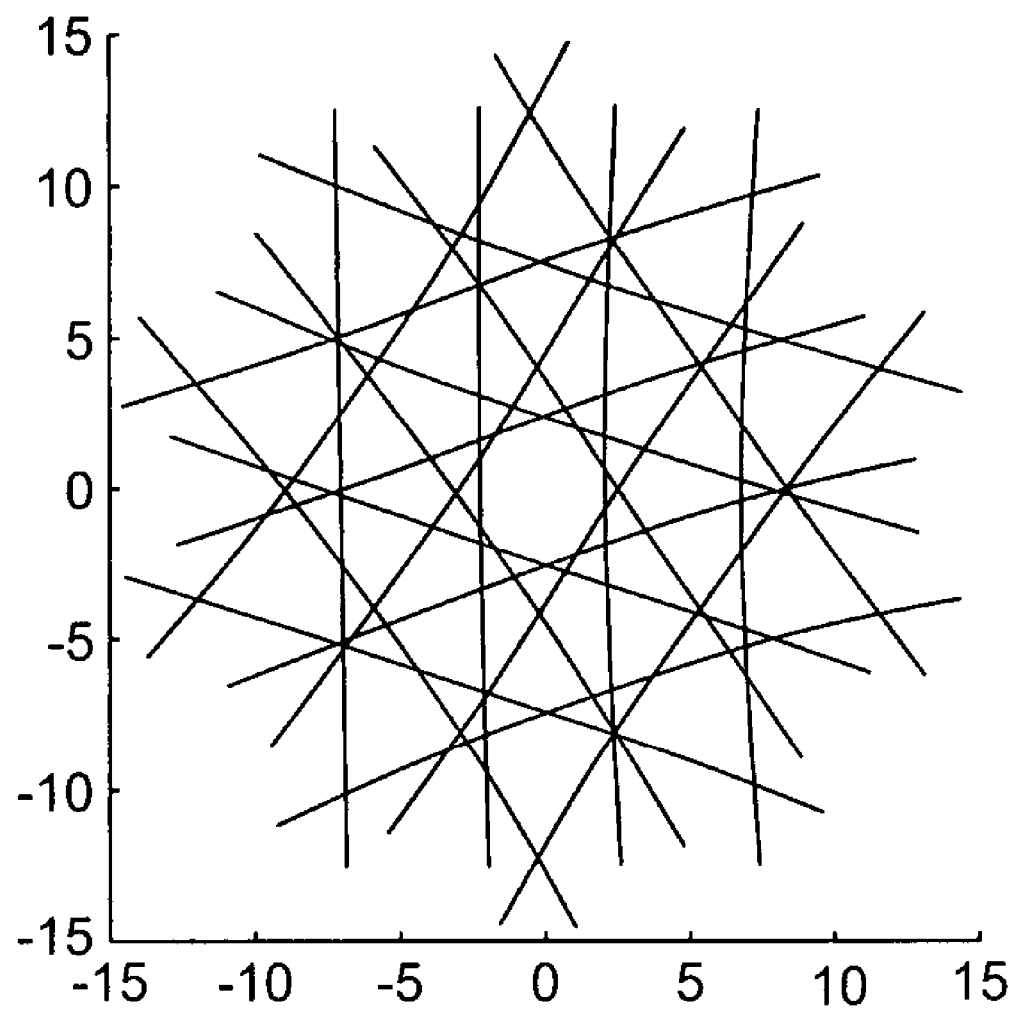
FIG. 5(F) is a schematic illustration of the middle focal plane of the omnidirectional scanning pattern produced by the holographic laser scanning system 100-A of the present invention as illustrated in FIGS. 5(A), 5(B) and 5(C).

In addition, the holographic laser scanning system 100-A preferably includes a control board (not shown) disposed with the housing 140 onto which is mounted a number of components mounted on a small PC board, namely: a programmed controller with a system bus and associated program and data storage memory, for controlling the system operation of the holographic laser scanner system 1090A and performing other auxiliary functions; serial data channels (for example, RS-232 channels) for receiving serial data input from the symbol decoding circuitry described above; an input/output (I/O) interface circuit 248 for interfacing with and transmitting symbol character data and other information to an I/O subsystem (which may be operably coupled to a data management computer system); home pulse detector, including a photodetector and associated circuitry, for detecting the home pulse generated when the laser beam from a VLD (in home pulse marking sensing module) is directed through home-pulse gap 260 (for example, between Facets Nos. 6 and 7 on the scanning disk 130 as shown in FIG. 5(D)) and sensed by the photodetector; and a home-offset-pulse (HOP) generator, which is preferably realized as an ASIC chip, for generating a set of home-offset pulses (HOPs) in response to the detection of each home pulse by the home pulse detector. The programmed controller produces motor control signals, and laser control signals during system operation that enable motor drive circuitry to drive the scanning disc motor coupled to holographic scanning disc 130 and enable the laser drive circuitry to drive the VLDs of the laser beam production modules 247A,247B, . . . 247E, respectively. A more detailed description of the control board and its respective components are disclosed in co-pending U.S. patent application Ser. No. 09/047,146 filed Mar. 24, 1998, co-pending U.S. patent application Ser. No. 09/157,778, filed Sep. 21, 1998, co-pending U.S. patent application Ser. No. 09/327,756 filed Jun. 7, 1999, co-pending U.S. patent application Ser. No.

09/551,887 filed Apr. 18, 2000, International Application No. PCT/US99/06505 filed Mar. 24, 1999, and International Application PCT/US00/15624, filed Jun. 7, 2000, all commonly assigned to the assignee of the present invention and herein incorporated by reference in their entirety.

As illustrated in FIG. 5(C), the laser scanning station LS1 includes a photodetector 111A (e.g., one or more silicon photocells) that is supported within the housing 140 of the holographic laser scanning system 100-A such that it intercepts the zeroth diffraction order as the incident laser beam is transmitted through the multifunction light diffractive grating 57 of the laser beam production module 147A as shown. The photodetector 111A produces a first electrical signal 112A indicative of the detected intensity the zeroth diffraction order laser beam emitted from the multifunction light diffractive grating 57 (which is proportional to the characteristic wavelength of the laser light beam emitted from the VLD 101A.

Note that monitoring the zeroth diffractive order beam for detecting mode switching (i.e., change in characteristic wavelength) of the VLD has many advantages. More specifically, because direction of the zeroth diffractive order beam is not sensitive to changes in wavelength of the VLD, there is no angular shift in the zeroth diffractive order beam as the characteristic wavelength of the VLD changes. These properties enable a single photodetector aligned with the zeroth diffractive order beam (and associated signal processing and control circuitry) to detect (and correct for) mode switching of the VLD, which is a simple, elegant, compact and cost-effective design.

The first electrical signal 112A generated by the photodetector 111A is supplied to signal processing circuitry 113A, which is preferably realized as integrated circuits mounted on the PC board 202A as shown. The signal processing circuitry 113A generates a mode switching signal 114A representing change in characteristic wavelength of the laser light beam emitted from the VLD 101A based upon the first electrical signal 112A. Preferably, the signal processing circuitry 113A amplifies and filters the first electrical signal 112A in order to improve the signal-to-noise ratio (SNR) of the mode switching signal 114A. A more detailed description of exemplary circuitry for realizing the photodetector 111A and signal processing circuitry 113A is described below with respect to FIGS. 7(A)(i), 7(A)(ii) and (B).

The mode switching signal 114A is supplied to a temperature controller 116A, which is preferably realized as one or more integrated circuits mounted on the PC board 202A as shown, that operates, in conjunction with a temperature control element 118A in thermal contact with the VLD 101A, to adjust temperature of the VLD 101A (if need be) based upon the values of the mode switching signal 114A supplied thereto, to thereby minimize and avoid changes in characteristic wavelength of the laser light beam emitted from the VLD 101A. A more detailed description of exemplary control routines executed by the temperature controller 116A in adjusting the temperature of the VLD 101A based upon the values of the mode switching signal 114A to thereby minimize and avoid changes in characteristic wavelength of the laser light beam emitted from the VLD 101A are described below with respect to FIGS. 8(A)-8(D)(iii)(b).

Preferably, the temperature control element 118A includes a passive cooling element (such as a heat sink that dissipates heat to ambient air) and an active heating element (such as a heating resistor or other active heating element affixed to the heat sink) placed in thermal contact with the VLD 101A. In this preferred embodiment, the temperature controller 116A increases temperature of the VLD 101A (i.e., heats the VLD 101A) by applying (or increasing) power supplied to the active heating element, and decreases temperature of the VLD 101A (i.e., cools the VLD 101A) by cutting-off (or decreasing) power supplied to the active heating element (thereby allowing the passive cooling element to cool the VLD 101A. The temperature controller 116A preferably controls the power supplied to the active heating element by controlling the pulse width of a pulsed-width modulated power signal supplied to the active heating element.

In an alternate embodiment, the temperature control element 118A may be a thermoelectric module (sometimes referred to as a Peltier device), in thermal contact with the VLD 101A that is capable of heating and cooling the VLD 101A under control of the temperature controller 116A. In another alternate embodiment, the temperature control element 118A may be an active heating element (such as a heating resistor or other active heating element) placed in thermal contact with the casing of VLD 101A.

Figure 5G:
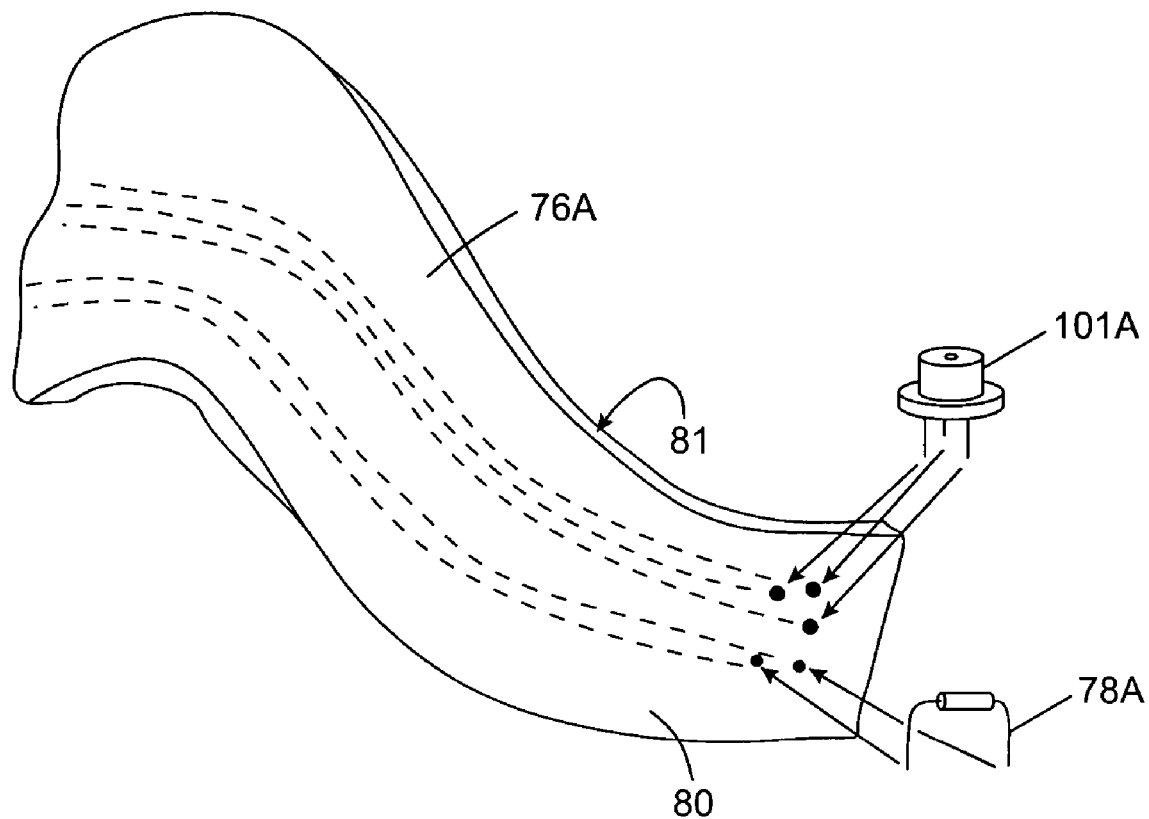
FIG. 5(G) is a schematic illustration of a flexible connector providing electrical signals from the laser drive circuitry and temperature control circuitry 116A mounted on the PC board 202A to the VLD 101A and temperature control elements 118A, respectively, as illustrated in FIG. 5(C).

As described above, the laser drive circuitry and temperature controller 116A associated with VLD 101A may be disposed on PC board 202A. In this illustrative embodiment, a flex cable 76A may be used to carry the laser drive signals from the laser drive circuitry on the PC board 202A to the VLD 101A mounted on the optical bench 143, and carry the temperature control signals (for example, pulse width modulated power signal) from the temperature controller 116A to the temperature control element 118A (e.g., heating resistor 78A) in thermal contact with the VLD 101A as illustrated in FIGS. 5(C) and 5(G). Note that the VLD 101A and heating resistor 78A are preferably through-hole parts mounted on the same side 80 of the flex cable 76A as shown. This enables the flex cable 76A to be realized as a single-sided flex cable wherein all signal traces are run on the side 81 of the flex cable opposite the side 80 onto which the VLD 101A and the heating resistor 78A are mounted.

Details and alternate embodiments of the exemplary holographic laser scanning system described above may be found in U.S. Pat. Nos. 6,158,659, 6,085,978, 6,073,846, and 5,984,185, and co-pending U.S. patent application Ser. No. 09/047,146 filed Mar. 24, 1998, co-pending U.S. patent application Ser. No. 09/157,778, filed Sep. 21, 1998, co-pending U.S. patent application Ser. No. 09/327,756 filed Jun. 7, 1999, co-pending U.S. patent application Ser. No. 09/551,887 filed Apr. 18, 2000, International Application No. PCT/US99/06505 filed Mar. 24, 1999, and International Application PCT/US00/15624, filed Jun. 7, 2000, all commonly assigned to the assignee of the present invention and herein incorporated by reference in their entirety.

The diffractive-based laser scanning system 100' of the present invention may also be a planar laser illumination module having diffractive optical elements for focusing and shaping of laser light beams to produce a substantially planar illumination beam that is swept through a scanning region adjacent thereto. An example of such a module is described in detail in co-pending U.S. application Ser. No. 09/721,885, filed Nov. 24, 2000, co-pending application Ser. No. 09/780,027, filed Feb. 9, 2001, and co-pending application Ser. No. 09/781,665, filed Feb. 12, 2001, all commonly assigned to the assignee of the present invention and herein incorporated by reference in their entirety.

The diffractive-based laser scanning system 100' of the present invention may also be a miniature laser scanning bar code reader engine having diffractive optical elements for focusing and shaping of laser light beams that are directed into a scanning region adjacent thereto. An example of such an engine is described in detail in U.S. Pat. No. 6,092,728 to Li et al., herein incorporated by reference in its entirety.

The diffractive-based laser scanning system 100' of the present invention may also be a holographic laser-doppler imaging and profiling device (referred to by Applicants as a holographic LDIP system). The holographic LDIP system utilizes one or more multi-faceted holographic optical elements to direct the outgoing laser light through the scanning region 105' (and collect the incoming laser light for capture by the optical detector(s)) for detecting and identifying profiles (such as dimensions or images) of objects in a scanning region. An exemplary holographic LDIP system 100-B for detecting and identifying profiles (such as dimensions and images) of objects in a scanning region is illustrated in detail in FIGS. 6(A) and 6(B).

In FIG. 6(A), the holographic LDIP system 100-B is realized so that one or more amplitude modulated (AM) laser scanning/ranging beams (two shown) are projected from its housing 3373 (i.e. optical bench). In the event that multiple AM laser beams are used, the AM laser beams preferably intersect the scanning region at different angles as shown. The holographic LDIP system 100-B has a holographic scanning disc 3370, rotatably mounted on an optical bench within the housing 3373, that: i) optionally, may generate multiple amplitude modulated laser beams (two shown) from the amplitude modulated laser beam produced from the laser beam production module 3340), and ii) projects each AM modulated beam generated therein (two shown) through a scanning plane (along multiple depths of focus) through a light transmission aperture 3373A formed in the housing 3373. In the event that the holographic scanning disk 3370 is designed to generate multiple amplitude modulated laser beams, it preferably projects these beams at different angles as required by the method of object velocity discussed in the above-mentioned patent applications.

The holographic LDIP system 100-B further comprises a parabolic light collecting mirror 3375 mounted beneath the holographic scanning disc 3370 for collecting reflected laser light off a scanned object (e.g. package) and focusing the same through a condenser-type lens 3376 onto a photodetector 3344 (for example, one or more of avalanche-type photodiode devices) mounted below the scanning disc 3370, and producing an electrical signal corresponding thereto.

In addition, the holographic LDIP system 100-B includes: signal processing circuitry for processing the produced electrical signal and generating raw digital range data representative of the distance from the holographic scanning element to sampled points along the scanned object (as well as digital scan data representative of any bar code symbol on the scanned surface of the object); and an image processor for preprocessing the raw digital range data to remove background information components, and processing the preprocessed range data so as to extract therefrom information regarding the dimensions (e.g. area, height, length, width, and/or vertices) and other physical attributes of the scanned object and produce data representative thereof as well as the velocity or other image data of the scanned object.

Many of the details regarding the construction of the LADAR-based imaging, detecting and dimensioning subsystem 3301B are taught in U.S. Pat. Nos. 6,158,659, 6,085,978, 6,073,846, and 5,984,185, and in co-pending U.S. patent application Ser. No. 09/047,146 filed Mar. 24, 1998, co-pending U.S. patent application Ser. No. 09/157,778, filed Sep. 21, 1998, co-pending U.S. patent application Ser. No. 09/327,756 filed Jun. 7, 1999, co-pending U.S. patent application Ser. No. 09/551,887 filed Apr. 18, 2000, International Application No. PCT/US99/06505 filed Mar. 24, 1999, and International Application PCT/US00/15624, filed Jun. 7, 2000, all commonly assigned to the assignee of the present invention and herein incorporated by reference in their entirety.

Notably, the laser production module 3340 includes one or more VLDs for producing a laser light beam. However, in the holographic LDIP system 100-B as shown in FIG. 6(B), the laser drive circuitry of the device 100-B drives the VLD(s) (one shown as VLD 101-B) such that it produces an amplitude-modulated (AM) laser beam at a frequency $f_0$. In addition, the laser production module 3340 includes a multi-function light diffractive grating 57-B (sometimes referred to by Applicants as "multi-function HOE" or "multi-function plate"). Similar to the multi-function diffraction grating 57A described above with respect to FIGS. 5(E)(i) and 5(E)(ii), the multi-function light diffractive grating 57-B produces a primary amplitude modulated laser beam that is directed toward the facets of the rotating scanning disk 3370 and a zeroth diffraction order beam (whose intensity is relatively weak compared to the intensity of the primary beam output therefrom). The multi-function light diffractive grating 57-B changes the properties of the incident laser beam so that the aspect ratio of the primary beam is controlled, and beam dispersion is minimized upon the primary laser beam exiting the holographic scanning disc 3370.

Details for designing the multi-function light diffractive grating 57-B and configuring the laser scanning disc 3370 of the illustrative embodiment is described in great detail in the above referenced U.S. patent applications.

The holographic scanning disc 3370 is mounted on the rotating shaft of an electric motor 3371 mounted on an optical bench within the system housing 3373. Similar to the scanning disc of FIG. 5(D), the holographic scanning disc 3370 of the holographic LDIP system 100-B has multiple facets (for example, 8 facets). Each facet has the same focal distance to essentially produce a collimated laser beam over the working distance of the system.

The design parameters for each facet on an exemplary holographic scanning disc are defined in detail in the above-referenced U.S. patent applications. Notably, four (of 8 total) scanning facets have one diffraction angle to generate the first AM laser scanning/ranging beam, while the remaining four facets have a different diffraction angle to produce the second AM laser scanning/ranging beam, to generate a pair of angularly separate scanning beams required by the method of object velocity computation as described therein.

A post-disk beam folding mirror 3374 is mounted above the scanning disc 3370, at a tilt angle which causes the reflected laser beams to travel above scanning disk, substantially parallel to the disk surface, and exit through the light transmission window 3373A at the opposite end of the subsystem scanner housing. This arrangement allows for a more compact scanner design and increases the optical path length inside the scanner box. In turn, this reduces the optical throw of the scanner (i.e. the minimum distance from the scanner window at which the scanner can read). By selecting the proper angle of diffraction off the scanning disc, it is possible, with this holographic laser scanner design, to minimize, and virtually eliminate, scan line bow so that the scan lines are all essentially straight lines. This has a number of important advantages in a variety of bar code scanning applications (e.g. when reading high density bar codes with high aspect ratios, when reading bar codes with relatively larger errors in orientation, and when reading bar code symbols at greater label velocities).

Alternatively, a second beam folding mirror (not shown) can be mounted within the scanner housing, just prior to the scanner window 3373A, in order to direct the AM laser beam out a new window formed on the top surface of the scanner, rather than on the side surface thereof, as shown in FIGS. 6(A) and 6(B). This modification to the scanner design would allow the AM laser beam(s) to exit the scanner housing perpendicular to the scanning disk, rather than parallel thereto. This modification would minimize the distance that the scanner extends out into the area next to a conveyor system, or it could reduce the required overhead space in an overhead scanning application. Other beam folding options are also envisioned.

The primary function of the exemplary holographic LDIP system 100-B of the present invention is to compute dimensions (such as height, width, length, width and/or vertex coordinates) and other physical attributes of objects transported through the scanning region adjacent thereto. This function is carried out using the scanning components described above to capture 2-D raw range data that is processed by an image processor to extract the dimensions (such as height, width, length, width and/or vertex coordinates) of objects passing through the scanning region.

Details and alternate embodiments of the exemplary holographic LDIP system described above may be found in co-pending U.S. patent application Ser. No. 09/327,756 filed Jun. 7, 1999, International Application No. PCT/US99/06505 filed Mar. 24, 1999, and International Application PCT/US00/15624, filed Jun. 7, 2000, all commonly assigned to the assignee of the present invention and herein incorporated by reference in their entirety.

Notably, the holographic LDIP system 100-B described above, without modification, can also function as compact single-line, laser scanner having very large depth of field, reduced optical throw, and laser scan lines with minimum curvature (i.e. minimum bow). The single line scanner uses a holographic disk to create a sequence of scan lines that all leave the disk at the same diffraction angle but have different focal lengths. In the illustrative embodiment of this scanner described above, the resulting linear scan pattern has six focal planes, providing a very large depth of field suitable for high density bar codes. As mentioned above, six different holographic facets for the six focal planes are spatially repeated three times around the disk for a total of eighteen facets on the scanning disk. This replication of the basic scan pattern results in a high speed scanner.

As illustrated in FIG. 6(B), the holographic LDIP system 100-B includes a photodetector 111-B (e.g., one or more silicon photocells) that is supported within the housing 3373 of the holographic LDIP system such that it intercepts the zeroth diffraction order as the amplitude modulated laser beam is transmitted through the multifunction light diffractive grating 57-B of the laser beam production module 3340 as shown. The photodetector 111-B produces a first electrical signal 112-B indicative of the detected intensity the zeroth diffraction order laser beam emitted from the multifunction light diffractive grating 57.

Note that because the laser beam incident on the multifunction light diffractive grating 57 is amplitude modulated at a frequency $f_0$, the changes is wavelength of the VLD cause amplitude variations in the zeroth diffraction order laser beam about the reference frequency $f_0$. Also note that monitoring the zeroth diffractive order beam for detecting mode switching (i.e., change in characteristic wavelength) of the VLD has many advantages. More specifically, because direction of the zeroth diffractive order beam is not sensitive to changes in wavelength of the VLD, there is no angular shift in the zeroth diffractive order beam as the wavelength of the VLD changes. These properties enable a single photodetector aligned with the zeroth diffractive order beam (and associated signal processing and control circuitry) to detect (and correct for) mode switching of the VLD, which is a simple, elegant, compact and cost-effective design.

The first electrical signal 112-B generated by the photodetector(s) 111-B is supplied to signal processing circuitry 113-B, which is preferably realized as integrated circuits supported within the housing 3370 as shown. The signal processing circuitry 113-B generates a mode switching signal 114-B representing change in characteristic wavelength of the laser light beam emitted from the VLD 101-B based upon the first electrical signal 112-B.

Preferably, the signal processing circuitry 113-B includes: an amplifier and filter circuit for isolating the $f_0$ signal component in the first electric signal 112-B and amplifying it; an AM demodulator for demodulating the reference $f_0$ signal (that is supplied to the laser drive circuitry to produce the amplitude modulated laser beam at the reference frequency $f_0$), and for demodulating the received $f_0$ signal component generated by the amplifier and filter circuit. The resultant signals are supplied to a differential amplifier that generates a signal representative of the difference between the reference $f_0$ signal and the received reference $f_0$ signal component. The AM demodulator preferably includes gain control circuitry for controlling the gain of the amplifier and filter circuit to maintain the demodulated $f_0$ signal component in an operating range corresponding to the levels of the reference $f_0$ signal. The mode switching signal 114-B representing change in characteristic wavelength of the laser light beam emitted from the VLD 101-B is derived from the primary components of the signal generated by the output of the differential amplifier.

The mode switching signal 114-B is supplied to a temperature controller 116-B, which is preferably realized as one or more integrated circuits mounted within the housing 3373 as shown, that operates, in conjunction with a temperature control element 118-B in thermal contact with the VLD 101-B, to adjust temperature of the VLD 101-B (if need be) based upon the values of the mode switching signal 114-B supplied thereto, to thereby minimize and avoid changes in characteristic wavelength of the laser light beam emitted from the VLD 101-B. A more detailed description of exemplary control routines executed by the temperature controller 116-B in adjusting the temperature of the VLD 101-B based upon the values of the mode switching signal 114-B to thereby minimize and avoid changes in characteristic wavelength of the laser light beam emitted from the VLD 101-B are described below with respect to FIGS. 8(A)-8(D)(iii)(b).

Preferably, the temperature control element 118-B includes a passive cooling element (such as a heat sink that dissipates heat to ambient air) and an active heating element (such as a heating resistor or other active heating element affixed to the heat sink) placed in thermal contact with the VLD 101-B. In this preferred embodiment, the temperature controller 116-B increases temperature of the VLD 101-B (i.e., heats the VLD 101-B) by applying (or increasing) power supplied to the active heating element, and decreases temperature of the VLD 101-B (i.e., cools the VLD 101-B) by cutting-off (or decreasing) power supplied to the active heating element (thereby allowing the passive cooling element to cool the VLD 101-B). The temperature controller 116-B preferably controls the power supplied to the active heating element by controlling the pulse width of a pulsed-width modulated power signal supplied to the active heating element.

In an alternate embodiment, the temperature control element 118-B may be a thermoelectric module (sometimes referred to as a Peltier device), in thermal contact with the VLD 101-B that is capable of heating and cooling the VLD 101-B under control of the temperature controller 116-B. In another alternate embodiment, the temperature control element 118-B may be an active heating element (such as a heating resistor or other active heating element) placed in thermal contact with the casing of VLD 101-B.

The laser drive circuitry and temperature controller 116-B associated with VLD 101-B may be disposed on PC board (not shown). In this illustrative embodiment, a flex cable 76-B may be used to carry the laser drive signals from the laser drive circuitry on the PC board to the VLD 101-B, and carry the temperature control signals (for example, pulse width modulated power signal) from the temperature controller 116-B to the temperature control element 118-B (e.g., heating resistor) in thermal contact with the VLD 101-B. Note that the VLD 101-B and temperature control element preferably comprise through-hole parts mounted on the same side of the flex cable 76-B, similar to the flex cable 76A shown in FIG. 5(G). This enables the flex cable 76-B to be realized as a single-sided flex cable wherein all signal traces are run on the side of the flex cable opposite the side onto which the VLD 101-B and the heating resistor are mounted.

FIGS. 7(A)(i), 7(A)(ii) and 7(B) illustrate exemplary embodiments of the photodetector 111A and signal processing circuitry 113A for detecting mode switching of a laser light source (e.g., VLD) employed in a diffractive-based laser scanning system (for example, the holographic laser scanning system 100A described above). In such a system, the optical detector 111A is preferably aligned to intercept the zeroth diffraction order beam produced by a diffractive optical element employed in the system (for example, produced by the multi-function diffraction grating 57 of the laser production module 147A of the holographic laser scanning system).

As shown in FIGS. 7(A)(i) and 7(A)(ii), the optical detector 111A may comprise one or more photo-diodes (three shown—D7, D7A, D7B), which produce an electrical signal indicative of the detected intensity the zeroth diffraction order laser beam emitted from the diffractive optical element (which is proportional to the wavelength of the laser light beam emitted from the VLD 101A). The output of the photodiodes (i.e., the first electrical signal 112A) is supplied to the signal processing circuitry 113A.

The signal processing circuitry 113A includes an AC coupling network that provides DC isolation (thereby eliminating the coupling of the DC steady state signal) and filters out high frequency noise components in the electrical signal supplied thereto. The resultant signal is supplied to a high gain amplifier (which may be realized as a multi-stage cascade design as shown) that amplifies the signal supplied thereto. The output of the high gain amplifier is provided to an RC network that generates two electrical signals: the first electrical signal represents an average wavelength of the laser light beam over a predetermined time period; and the second electrical signal represents current wavelength of the laser light beam. These two signals are supplied as inputs to a two-stage comparator. The first electrical signal is generated by the network R109, R110, R111 and C58, thereby establishing a reference level based upon the average level of output from the high gain amplifier for input to the 2 stage comparator.

The first comparator stage U24D compares the first and second electrical signals generated by the RC network. When the excursions of the second electrical signal drop beneath the reference level provided by the first electrical signal, the output of the first comparator stage discharges capacitor C59. The discharging time is relatively short compared to the charging time of C59 (which is governed principally by R112). This effectively stretches the pulse width to enable detection by the temperature controller 118A (whose sampling time is less than the typical width of mode switching pulses exhibited on the output of the high gain amplifier). Thus, the output of the first comparator stage represents an electrical signal that represents change in characteristic wavelength (i.e., mode switching) of the VLD 101A. The second comparator U24C is a threshold detector that converts the signal found on capacitor C59 to a logic 0 or 1 level, thereby providing a digital signal (i.e., digital mode switching signal) for input to the I/O port (not shown) of the temperature controller 116A. One of the logic levels (for example, logic level 0) of the digital mode switching signal indicates that mode switching (i.e., a change in characteristic wavelength) did not occur during the last sampling period, and the other logic level (for example, logic level 1) indicates that mode switching did occur during the last sampling period.

The temperature controller 116A, which is preferably realized as a microcontroller mounted on the PC board 202A as shown, operates, in conjunction with a temperature control element 118A in thermal contact with the VLD 101A, to adjust temperature of the VLD 101A (if need be) based upon the levels of the mode switching signal supplied thereto, to thereby minimize and avoid changes in characteristic wavelength of the laser light beam emitted from the VLD 101A. A more detailed description of exemplary control routines executed by the temperature controller 116A in adjusting the temperature of the VLD 101A based upon the values of the mode switching signal to thereby minimize and avoid changes in characteristic wavelength of the laser light beam emitted from the VLD 101A are described below with respect to FIGS. 8(A)-8(D)(iii)(b).

Figure 7B:
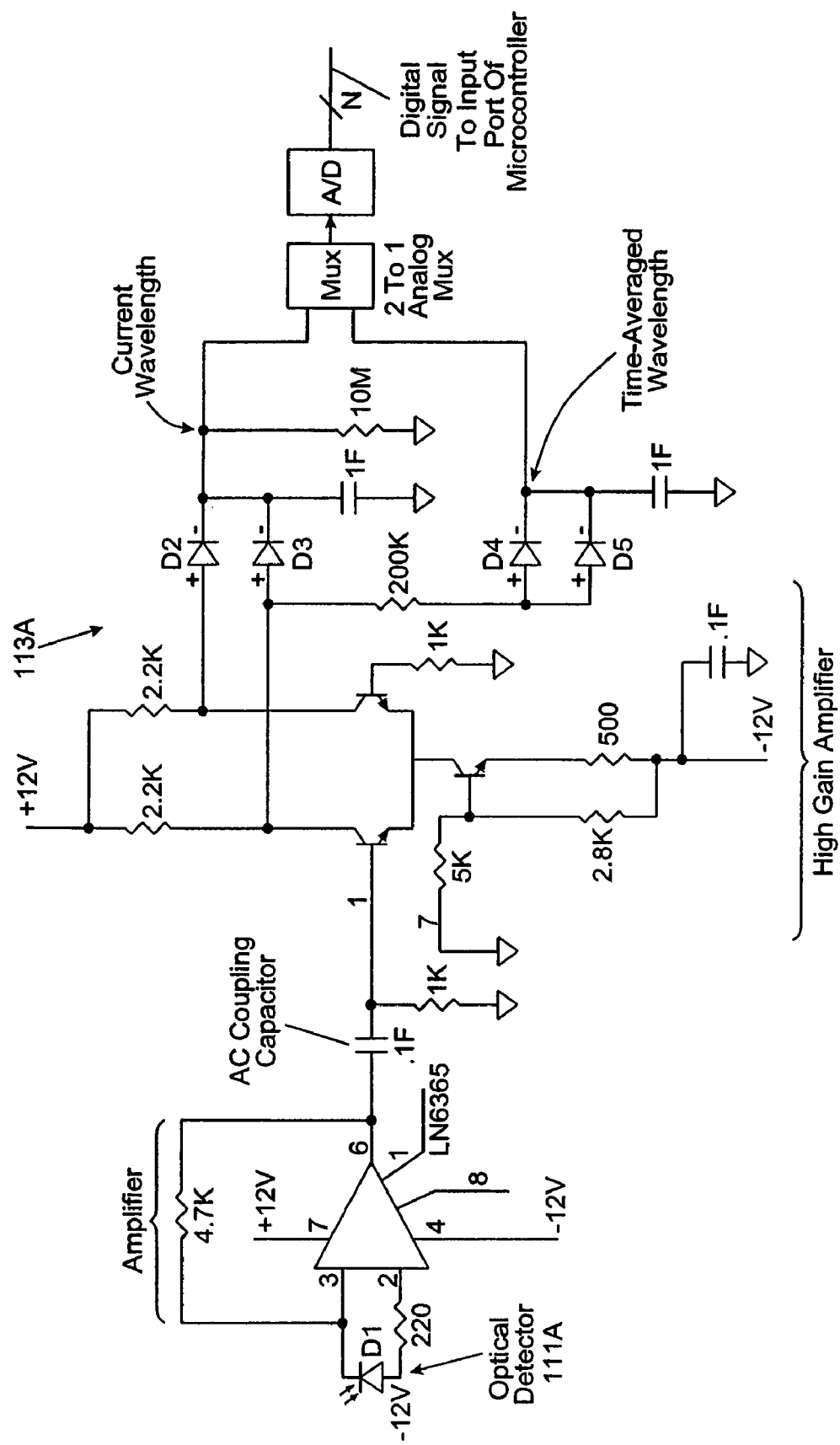

FIG. 7(B) illustrates another exemplary embodiment of the photodetector 111A and signal processing circuitry 113A for detecting mode switching of the VLD 101A of the diffractive based laser scanning system of the present invention described above. As described above, the optical detector devices 111A are aligned to intercept the zeroth diffractive order beam produced from a diffractive optical element employed in the system (for example, produced by the multi-function diffraction grating 57 of the laser production module 147A of the holographic laser scanning system described above).

As shown in FIG. 7(B), the optical detector 111A may comprise one or photo-diodes (one shown), which produces an electrical signal indicative of the detected intensity the zeroth diffractive order laser beam produced from the diffractive optical element employed by the system (which is proportional to the characteristic wavelength of the laser light beam emitted from the VLD 101A). The output of the photodiode (i.e., the first electrical signal 112A) is supplied to the signal processing circuitry 113A.

The signal processing circuitry 113A includes a pre-amplifier that amplifies and filters the output of the photodiodes to improve the signal to noise ratio therein. An AC coupling network provides DC isolation between the pre-amplifier and a high gain amplifier (which may be realized as a differential amplifier as shown). The resultant signal generated the high gain amplifier is provided to an RC network that generates two electrical signals: the first electrical signal represents an average wavelength of the laser light beam over a predetermined time period; and the second electrical signal represents current wavelength of the laser light beam. The first electrical signal is generated by the network R7, C11. These two signals are converted to N bit digital signals (for example by a multiplexer and analog-to-digital converter as shown) and supplied to the temperature controller via its I/O ports (not shown). The temperature controller 116A is preferably realized as a microcontroller mounted on the PC board 202A.

The temperature controller 116A samples the digital data values of the two signals supplied thereto, and determines if the difference between the two signals exceeds a predetermined threshold. In response thereto, the temperature controller 118A generates a digital mode switching signal (flag) with a logic level 0 or 1 (for example, by setting (or clearing) a predetermined bit in the memory space of the temperature controller). One of the logic levels (for example, logic level 0) of the digital mode switching signal (flag) indicates that mode switching (i.e., a change in characteristic wavelength) did not occur during the last sampling period, and the other logic level (for example, logic level 1) indicates that mode switching did occur during the last sampling period.

The temperature controller 116A, operates, in conjunction with a temperature control element 118A in thermal contact with the VLD 101A, to adjust temperature of the VLD 101A (if need be) based upon the levels of the digital mode switching signal supplied thereto, to thereby minimize and avoid changes in characteristic wavelength of the laser light beam emitted from the VLD 101A. A more detailed description of exemplary control routines executed by the temperature controller 116A in adjusting the temperature of the VLD 101A based upon the values of the mode switching signal to thereby minimize and avoid changes in characteristic wavelength of the laser light beam emitted from the VLD 101A is described below with respect to FIGS. 8(A)-8(D)(iii)(b).

FIGS. 8(A)-8(D)(iii)(b) illustrate exemplary control routines executed by the temperature controller 116A in adjusting the temperature of the VLD 101A based upon the values of the mode switching signal supplied thereto, to thereby minimize and avoid changes in characteristic wavelength of the laser light beam emitted from the VLD 101A. Any one of these control routines, when used, is preferably stored as a programmed sequence of instructions in the memory space of the temperature controller 116A and loaded therefrom for execution by the processor of the temperature controller 116A. In these control routines, a digital mode switching signal (or flag) is derived from the mode switching signal(s) generated by the signal processing circuitry 113 and indicates that mode switching (i.e., a change in characteristic wavelength) occurred during the last sampling period (for example, set to a logic level 1 as described above).

FIG. 8(A), which includes two drawing sheets 8(A)(i) and 8(A)(ii), is pseudo-code describing a first illustrative embodiment of the control routine executed by the temperature controller 116A in adjusting the temperature of the VLD 101A. In this illustrative embodiment, the temperature controller 116A controls the temperature of the VLD 101A by varying the pulse width (i.e., duty cycle) of a pulse width modulated signal output via an I/O port of the temperature controller 116A, which controls the pulse width (i.e., duty cycle) of a pulse width modulated power signal supplied to a heating resistor placed in thermal contact with the VLD 101A.

More specifically, when the logic level of the digital mode switching signal (flag) indicates that mode switching (i.e., a change in characteristic wavelength) occurred during the last sampling period (for example, set to a logic level 1 as described above), the heat supplied to the VLD 101A is turned fully ON or OFF (by setting the pulse width of the pulse width modulated output signal to fully ON (100% of $PW_{max}$) or fully OFF (0% of $PW_{max}$), respectively) to change the temperature of the VLD 101A as rapidly as possibly. The heat supplied to the VLD 101A is controlled over a range. The control routine starts at zero heat (0% of $PW_{max}$), then starts increasing the heat supplied to the VLD 101A (increasing temperature direction) as mode switching occurs. When the control routine reaches the top of the range (maximum heat), the only room for adjustment is by reversing direction (i.e., decreasing temperature direction). Thereafter, it decreases the heat supplied to the VLD 101A as mode switching occurs. When the control routine reaches minimum heat, then the control routine again reverses direction and increases temperature of the VLD 101A as mode switching occurs. Thus, during the course of operation, the control routine moved back and forth between a minimum and maximum heat. The maximum heat is selected to provide enough range to move the VLD 101A out of mode switching, but small enough so as to not significantly affect the operational lifetime of the VLD 101A.

During operation of the control routine, the temperature of the VLD 101A is adjusted as mode switching occurs. After mode switching stops (i.e., the logic level of the digital mode switching signal (flag) indicates that mode switching did not occur during the last sampling period), the control routine determines the pulse width output that will substantially maintain that temperature.

In this illustrative embodiment, low cost circuitry is used that does not provide for direct measurement of the operational temperature of the VLD 101A. Instead, the temperature of the VLD 101A can be approximated using a look-up table.

More specifically, the temperature rise of the VLD 101A can be approximated using the following formula:

$$T=T_b+T_d*(1-e^{-(\Delta t/T_c)}) \text{ where}$$

T is the final temperature;
$T_b$ is the starting temperature;
$T_d$ is the temperature range;
$\Delta t$ is the time period that the heat is supplied to the VLD 101A;
$T_c$ is the time constant of the temperature control element.

And the temperature fall of the VLD 101A can be approximated using the following formula:

$$T=T_b-T_d*(1-e^{-(\Delta t/T_c)}) \text{ where}$$

T is the final temperature;
$T_b$ is the starting temperature;
$T_d$ is the temperature range;
$\Delta t$ is the time period that the no heat is supplied to the VLD 101A;
$T_c$ is the time constant of the temperature control element.

Curves corresponding to these formulas can be fit to characterization data representing the operational temperature rise and fall of the VLD 101A in response to low frequency variations in the pulse width (i.e., duty cycle) of the pulse width modulated power signal supplied to the heating resistor placed in thermal contact with the VLD 101A. Such characterization data can be measured from the operating characteristics of the VLD 101A once prior to customer use of the laser scanning system, or from the operating characteristics of a similar VLD/thermal control arrangement in another laser scanning system. These curves provide an approximate correlation between the temperature of the VLD 101A and the pulse width (i.e., duty cycle) of the pulse width modulated power signal as the pulse width is varied over the control range.

These curves are used to generate entries in a look-up table that is stored by the temperature controller 116A. A first set of entries in the look-up table corresponds to increasing pulse width output values. A second set of entries in the look-up table corresponds to decreasing pulse width output values in the control range. For example, the first set of entries may include thirty-two entries corresponding to thirty-two step-ups in the pulse width output (e.g., duty cycle) ranging from 0% to 100% duty cycle, and the second set of entries may include thirty-two entries corresponding to thirty-two step-downs in the pulse width output (e.g., duty cycle) ranging from 100% to 0% duty cycle. Each entry in the first set stores data representing an approximate time duration for the VLD 101A to reach the temperature corresponding to the next entry in the first set (i.e., the next entry in the heating direction (i.e., UP)) when the pulsed width output signal is fully ON. Each entry in the second set stores data representing an approximate time duration for the VLD 101A to reach the temperature corresponding to the next entry in the second set (i.e., the next entry in the cooling direction (i.e., DOWN)) when the pulsed width output signal is fully OFF.

The look-up table is accessed during operation of the control routine in the event that mode switching stops to determine the pulse width output value that will substantially maintain that temperature. More specifically, the look-up table uses:

i) the given pulse width output value before mode switching started, and ii) the duration of mode switching, to identify the interval of look-up table entries (starting from the entry corresponding the given pulse width output value) whose cumulative time duration most closely matches the duration of mode switching. The cumulative time duration of this interval is calculated by adding the data stored in the entries of the interval. When operating in the heating direction (e.g., UP), the entries of this interval belong to the first set of entries. When operating in the cooling direction (e.g., DOWN), the entries of this interval belong to the second set of entries. The pulse width output value of the last entry in the identified interval is used by the control routine to substantially maintain the temperature of the VLD 101A at the control point where mode switching stops.

As illustrated in FIG. 8(A), the control routine begins in step 15 by initializing a direction flag to a logical "UP" direction. The direction flag represent the direction of temperature adjustment within the range, either "UP" (heating) or "DOWN" (cooling). The operation then continues to a main loop (steps 20-320). In step 25 of the main loop, the control routine determines if the logic level of the digital mode switching signal (flag) indicates that mode switching occurred during the last sampling period (mode switching=ON). If so, operation continues to step 30 to identify the direction of temperature adjustment; otherwise the operation continues step 290 to update the pulse width output (if need be) to maintain the substantially maintain the temperature of the VLD 101A. If, in step 30, the direction is UP, a heat loop is performed (steps 40-160) to increase the temperature of the VLD 101A as rapidly as possible in order to bring the VLD 101A out of mode switching; otherwise (the direction is DOWN), a cool loop is performed (steps 175-275) to decrease the temperature of the VLD 101A as rapidly as possible in order to bring the VLD 101A out of mode switching.

In the heat loop (steps 40-160), the heat supplied to the VLD 101A is turned fully ON (by setting the pulse width of the pulse width modulated output signal to fully ON (100% of $PW_{max}$) in step 50 until mode switching stops (step 60) or the top of the heating range is encountered (step 110). When mode switching stops (which is detected in step 60), the control routine accesses the look-up table to determine the pulse width output that will substantially maintain that temperature of the VLD 101A, updates the pulse width output accordingly to maintain that temperature, and branches to the main loop (steps 20-320). When the top of the range is reached (step 115), the control routine reverse direction (sets the direction flag to DOWN) and jumps to the cool loop (steps 175-275).

In the cool loop (steps 175-275), the heat supplied to the VLD 101A is turned fully OFF (by setting the pulse width of the pulse width modulated output signal to fully OFF (0% of $PW_{max}$) in step 180 until mode switching stops (step 185) or the bottom of the heating range is encountered (step 230). When mode switching stops (which is detected in step 185), the control routine accesses the look-up table to determine the pulse width output that will substantially maintain that temperature of the VLD 101A, updates the pulse width output accordingly to maintain that temperature, and branches to the main loop (steps 20-320). When the bottom of the range is reached (step 230), the control routine reverse direction (sets the direction flag to UP) and jumps to the heat loop (steps 40-160).

FIG. 8(B) is pseudo-code describing a second illustrative embodiment of the control routine executed by the temperature controller 116A in adjusting the temperature of the VLD 101A. The operation is similar to the control routine of FIG. 8(A), except that that the current power level (i.e., the value of the pulse width modulated control signal) is used to determine whether to perform the heat loop or cool loop in adjusting the temperature of the VLD 101A to bring it out of mode switching operation. More specifically, in the event that mode switching is detected (step 20), the operation continues to step 30 to determine if the current power level is in the lower half (or upper half) of the temperature control range. If in the lower half of the temperature control range, the heat loop (steps 40-160) is performed. If in the upper half of the temperature control range, the cool loop (steps 175-275) is performed.

FIGS. 8(C) and (D) are flow charts and corresponding source code describing a third illustrative embodiment of the control routine executed by the temperature controller 116A in adjusting the temperature of the VLD 101A. In this third illustrative embodiment, the temperature controller 116A controls the temperature of the VLD 101A by varying the pulse width (i.e., duty cycle) of a pulse width modulated signal output via the I/O port of the temperature controller 116A, which controls the pulse width (i.e., duty cycle) of a pulse width modulated power signal supplied to a heating resistor placed in thermal contact with the VLD 101A. The source code is assembly code for use with a microcontroller belonging to the Microchip PIC12C5XX family.

The control routine includes a main loop (labeled "main") and two subroutines "pulse" and "mode". The "pulse" subroutine performs the following functions:

i) it generates the pulse width modulated output that controls the heating power level supplied to the heating resistor;

ii) it monitors a mode switching signal (for example, the output of the threshold detector U24C of FIG. 7(A)) supplied to the I/O port of the temperature controller during a 65 millisecond sampling period; and iii) updates a counter (modeswitch_255) that counts the number of subintervals in this 65 millisecond period that the mode switching signal was ON.

The "mode" subroutine compares the value of this modeswitch_255 counter against a predetermined threshold. If the counter exceeds the threshold, a mode switching flag is set to ON; otherwise the mode switching flag is set to OFF.

The control routine begins by initializing a direction flag to a logical "UP" direction, initializing the pulse width modulated output signal (duty cycle) to zero and turning the heater off, and clearing a table pointer. The table pointer provides an estimate of the temperature of the VLD 101A within the heating range, and the direction flag represent the direction of temperature adjustment within the range, either an "UP" (heating) or "DOWN" (cooling) direction.

The control routine continues to a main loop wherein a rise time (if direction=UP) or a fall time (direction=DOWN) is loaded into a counter (Pntr_Cntr) and a corresponding flag (Pntr_Cntr_Flag) is cleared. The rise and fall times may differ for different environments (for example, for circulating air and still air). In this case, a jumper (or software switch) may be used to selectively load the correct rise time (or fall time) as shown).

The main loop then determines if the mode switching flag is set. If not, the operation branches to main1 as described below; otherwise, the counter (Pntr_Cntr) is decremented. If the counter (Pntr_Cntr) is not zero, the operation continues to main2; otherwise the corresponding flag (Pntr_Cntr_Flag) is set, the table pointer is incremented and operation continues to main2.

In main2, the control routine identifies the direction ("UP" or "DOWN"). If the direction is UP, the pulse width (i.e., duty cycle) of the pulse width modulated control signal is set to fully ON (100% of $PW_{max}$), and operation continues to main5. If the direction is DOWN, the pulse width (i.e., duty cycle) of the pulse width modulated control signal is set to fully OFF (0% of $PW_{max}$), and operation continues to main5.

In main1, the look-up table is accessed to determine the pulse width (i.e., duty cycle) of the pulse width modulated control signal to maintain the current temperature of the VLD 101A based upon the pulse width output before mode switching started and the duration of mode switching, and operation continues to main5.

In main5, it is determined if the pulse width (i.e., duty cycle) of the pulse width modulated control signal is set to zero. If so, the heater is turned off and operation continues to main4; otherwise, the heater is turned on and operation continues to main 4.

In main4, the control routine determines of the flag (Pntr_Cntr_Flag) is set. If not, the operation continues to main6; otherwise the rise time (if direction=UP) or fall time (direction=DOWN) is loaded into the counter (Pntr_Cntr), the flag (Pntr_Cntr_Flag) is reset, and operation continues to main6.

In main6, the pulse subroutine is called, the mode subroutine is then called, and the operation loops back to main to continue the control routine. In main6, the "pulse" subroutine generates and outputs the pulse width modulated output (based upon the pulse width values set in main1 or main 2) that controls the heating power level supplied to the heating resistor, and monitors the digital mode switching signal supplied to the I/O port of the microcontroller during a 65 millisecond sampling period. In addition, a counter (modeswitch_255) is updated to count the number of sub-intervals in this 65 millisecond period that the digital mode switching signal supplied via the I/O port is ON. The "mode" subroutine then updates the mode switching flag by comparing the value of this modeswitch_255 counter against a predetermined threshold. If the modeswitch_255 counter exceeds the threshold, the mode switching flag is set to ON; otherwise the mode switching flag is set to OFF.

Advantages and Other Features of the System of the Present Invention

The improved diffractive-based laser scanning system of the present invention monitors portions of the laser light beams generated by a laser light source employed therein to generate a mode switching signal indicative of a shift in the characteristic wavelength of the laser light beams emitted from the laser light source. In response thereto, a temperature controller selectively heats (or cool) the laser light source to minimize and avoid such wavelength changes, thereby mitigating any potential problems caused by such wavelength changes (for example, unwanted beam distortion and signal processing errors as described above).

Preferably, mode switching (e.g., change in characteristic wavelength of light emitted from the laser light source) is detected by monitoring a zeroth diffractive order beam produced by a diffractive element of the system. Such a system takes advantage of the fact that there is no angular shift in the zeroth diffractive order beam as the characteristic wavelength of the VLD changes (because direction of the zeroth diffractive order beam is not sensitive to changes in wavelength of the VLD). These properties enable a single photodetector aligned with the zeroth diffractive order beam (and associated signal processing and control circuitry) to detect (and correct for) mode switching of the VLD, which is a simple, elegant, compact and cost-effective design.

Moreover, temperature control of the laser light source is preferably accomplished using active heating elements (e.g., a heating resistor) and passive cooling elements (e.g., a heat sink) in thermal contact with the laser light source. Such elements contribute further to a simple and cost-effective design.

In addition, the temperature control of the laser light source is preferably accomplished over a heating range (between a minimum heat and maximum heat applied to the laser light source), whereby temperature within this range is approximated by a look-up table. Such a scheme may be implemented by an inexpensive microcontroller, which eliminates the costs for directly measuring the temperature of the laser light source thereby contributing further to a simple and cost-effective design.

In an alternate embodiment of the present invention, the diffractive-based laser scanning system may include a temperature sensor which substantially measures the temperature of the laser light source (e.g., VLD 101A). The temperature sensor may consist of a thermocouple (or solid state temperature sensor or thermistor) mounted to the laser light source (or the temperature control element 118A in thermal contact therewith. Alternatively, the temperature of the VLD 101A may be measured from the voltage drop across the diode junction of the VLD 101A. More specifically, the diode junction has a negative temperature coefficient of about −1.6 mV/° C. This signal rides on top of a large common mode signal that also has a component due to current variations through the VLD 101A. Thus, both the common mode signal and current variation component must be removed to achieve an accurate temperature reading. This requires a good instrumentation amplifier.

In this alternate embodiment, this temperature measurement signal can be used to make any one of the control routines described above smarter. More specifically, when mode switching occurs, the temperature measurement signal can be used to detect the direction of temperature change (UP or DOWN) that resulted in mode switching, and then change the pulse width of the pulse width output control signal to adjust the temperature of the VLD 101A in the opposite direction to attempt to maintain the temperature that did not cause mode switching. When the top (or bottom) of the heating range is encountered, the direction is reversed as described above to bring the VLD 101A out of mode switching rapidly. These modifications require more complicated circuitry (the temperature sensor and/or instrumentation amplifier), yet reduce the amount of mode switching activity.

In another alternate embodiment, the diffractive-based laser scanning system may include a temperature sensor which substantially measures the temperature of the laser light source (e.g., thermocouple, thermistor, or instrumentation amplifier measuring voltage drop across laser diode as described above) and program memory (for example, non-volatile memory such as a ROM or EEPROM, or volatile memory such a RAM) that stores the mode switching characteristics of the VLD 101A over its operating temperature range (e.g., data that indicates the temperature intervals in which the VLD 101A experiences mode switching). In this alternate embodiment, the measured temperature signal and data stored in the program memory can be used to maintain the operation of the VLD 101A in temperature regions that do not exhibit mode switching and take preventive measures before any mode switching occurs. The only time when one would have to pass through the mode switching range (and execute any one of the control routines as described above) is during characterization of the VLD 101A, or when the end (top or bottom) of the heating range is reached and the heating direction must be reversed.

In this alternate embodiment, the operating characteristics of the VLD 101A may be characterized once prior to customer use of the laser scanning system. In this case, the data is stored in non-volatile memory (such as a ROM). Thus, each VLD 101A may be associated with a ROM that stores characterization data unique to the VLD device. This technique is useful only if the mode switching characteristics of the VLD device do not substantially change over the operational lifetime of the VLD. Alternatively, the operating characteristics of the VLD 101A may be characterized dynamically over the operating lifetime of the VLD 101A. In this case, the data is stored in programmable memory (such as a EEPROM or RAM). Thus, each VLD 101A may be associated with a programmable memory shat stored characterization data unique to the VLD device over its operational lifetime. When storing the data in RAM, the characterization data is lost when power to the RAM is removed (e.g., when the system is turned off). In such a system, the characterization data must be rebuilt and stored in RAM when the power is restored.

It is understood that the laser scanning systems, modules, engines and subsystems of the illustrative embodiments may be modified in a variety of ways which will become readily apparent to those skilled in the art, and having the benefit of the novel teachings disclosed herein. All such modifications and variations of the illustrative embodiments thereof shall be deemed to be within the scope and spirit of the present invention as defined by the Claims to Invention appended hereto.

What is claimed is:

1. A laser scanning system comprising:
a laser light source emitting a laser light beam;
an optical subsystem, including at least one diffractive optical element, that directs a first portion of the laser light beam into a scanning region and directs a second portion of the laser light beam to an optical detector, wherein the optical detector generates a first electrical signal in response thereto;
a temperature control element, in thermal contact with the laser light source, that is capable of adjusting temperature of the laser light source;
signal processing and control circuitry, operably coupled between the optical detector and the temperature control element, that generates a second electrical signal representing change in characteristic wavelength of the laser light beam emitted from the laser light source based upon the first electrical signal, and controls the temperature control element to adjust temperature of the laser light source based upon the second electrical signal;
wherein said signal processing and control circuitry generates a binary mode switching signal having a logic level indicating whether said second electrical signal exceeds said predetermined threshold value,
wherein said binary mode switching signal is supplied to a microcontroller programmed to execute a control routine that controls said temperature control element so as to adjust temperature of said laser light source in response to the logic level of said binary mode switching signal;
wherein said control routine controls said temperature control element so as to either heat or cool said laser light source when the logic level of said binary mode switching signal indicates that a change in the characteristic wavelength of said laser light source occurred in said laser scanning system; and
wherein said control routine controls said temperature control element to maintain the temperature of said laser light source when the logic level of said binary mode switching signal indicates that a change in the characteristic wavelength of said laser light source did not occur in said laser scanning system.

2. The laser scanning system of claim 1, wherein a lookup table is used to generate said control signal supplied to said temperature control element in order to heat, cool or maintain the temperature of said laser light source; and
wherein the values of said control signal stored in said lookup table are based upon the value of said control signal when mode switching begins and the time duration of mode switching.

3. The laser scanning system of claim 1, wherein temperature adjustment of said laser light source results in a decrease in variation of the characteristic wavelength of said laser light source.

4. The laser scanning system of claim 1, wherein a zeroth order beam is produced by the at least one diffractive optical element, and wherein said optical detector is aligned with the zeroth order beam.

5. The laser scanning system of claim 1, wherein said laser light source comprises a visible laser diode.

6. The laser scanning system of claim 5, wherein the visible laser diode comprises at least one solid-state lasing element.

7. The laser scanning system of claim 1, wherein the diffractive optical element comprises a holographic optical element that directs light reflected off surfaces in the scanning region along a return optical path to at least one photodetector, and wherein said signal processing and control circuitry analyzes signals generated by the at least one photodetector in response to light received along the return optical path.

8. The laser scanning system of claim 1, wherein said optical subsystem comprises a rotating disc with multiple holographic optical elements disposed thereon for generating a scan pattern through the scanning region.

9. The laser scanning system of claim 1, wherein said laser light source and said optical subsystem generate at least one AM modulated laser beam for generating range data characterizing at least one spatial dimension of objects passing through scanning region.

10. The laser scanning system of claim 9, wherein the at least one spatial dimension comprises a profile, volume, or velocity of the object passing through the scanning region.

11. The laser scanning system of claim 1, wherein said optical detector comprises at least one photo-diode device.

12. The laser scanning system of claim 1, wherein said temperature control element utilizes an active heating element and a passive cooling element.

13. The laser scanning system of claim 12, wherein the active heating element comprises a resistor in thermal contact with said laser light source.

14. The laser scanning system of claim 12, wherein said passive cooling element comprises a heat sink in thermal contact with said laser light source, and wherein said heat sink passively dissipates heat to ambient air.

15. The laser scanning system of claim 1, wherein said temperature control element comprises a resistive element affixed to a heat sink in thermal contact with said laser light source.

16. The laser scanning system of claim 15, wherein temperature of said laser light source is adjusted by varying power supplied to said resistive element.

17. The laser scanning system of claim 15, wherein temperature of said laser light source is adjusted by varying duty cycle of a pulse modulated power signal supplied to said resistive element.

18. The laser scanning system of claim 1, wherein said temperature control element comprises a thermoelectric device in thermal contact with said laser light source.

19. The laser scanning system of claim 1, wherein said signal processing and control circuitry comprises a high gain amplifier for amplifying said first electrical signal.

\* \* \* \* \*

UNITED STATES PATENT AND TRADEMARK OFFICE
CERTIFICATE OF CORRECTION

| | | |
|---|---|---|
| PATENT NO. | : 7,534,994 B2 | |
| APPLICATION NO. | : 11/810054 | |
| DATED | : May 19, 2009 | |
| INVENTOR(S) | : Frank Check | |

It is certified that error appears in the above-identified patent and that said Letters Patent is hereby corrected as shown below:

See attached sheets 1-9 for paragraphs of Specification and Claims after entry of Amendment Under Rule 312.

UNITED STATES PATENT AND TRADEMARK OFFICE
CERTIFICATE OF CORRECTION

| | |
|---|---|
| PATENT NO. | : 7,534,994 B2 |
| APPLICATION NO. | : 11/810054 |
| DATED | : May 19, 2009 |
| INVENTOR(S) | : Frank Check |

It is certified that error appears in the above-identified patent and that said Letters Patent is hereby corrected as shown below:

In Column 6, the last paragraph should read as follows:

Fig. 6(A) is a schematic illustration of a holographic laser dimensioning, imaging and profiling system (holographic LDIP system) of the present invention realized so that one or more amplitude modulated (AM) laser scanning/ranging beams (two shown) are projected from its housing 3373 (i.e. optical bench); a holographic scanning disc 3370, rotatably mounted on an optical bench within the housing 3373, may generate multiple amplitude modulated laser beams (two shown) from the amplitude modulated laser beam produced from the laser beam production module 3340), and project each AM modulated beam generated therein (two shown) through a scanning plane (along multiple depths of focus) through a light transmission aperture 3373A formed in the housing 3373; a parabolic light collecting mirror 3375 mounted beneath the holographic scanning disc 3370 collects reflected laser light off a scanned object (e.g. package) and focusing the same through a condenser-type lens 3376 onto a photodetector 3344 (for example, one or more an avalanche-type photo-diode devices) mounted below the scanning disc 3370, and producing an electrical signal corresponding thereto; signal processing circuitry processes the produced electrical signal and generates raw digital range data representative of the distance from the holographic scanning element to sampled points along the scanned object (as well as digital scan data representative of any bar code symbol on the scanned surface of the object); an image processor preprocesses the raw digital range data to remove background information components, and processes the preprocessed range data so as to extract information regarding the dimensions (e.g. area, height, length, width, and/or vertices) and other physical attributes of the scanned object and produce data representative thereof as well as the velocity or other image data of the scanned object.

In Column 7, the third and last paragraphs should read as follows:

Figs. 8(A) - 8(D)(iii)(a) illustrate exemplary control routines executed by the temperature controller of the diffractive-based laser scanning systems of the present invention in adjusting the temperature of the laser light source (e.g., VLD) employed therein based upon the values of the mode switching signal supplied thereto, to thereby minimize and avoid changes in characteristic wavelength of the laser light beams emitted from the laser light source (e.g., VLD).

UNITED STATES PATENT AND TRADEMARK OFFICE
CERTIFICATE OF CORRECTION

PATENT NO. : 7,534,994 B2
APPLICATION NO. : 11/810054
DATED : May 19, 2009
INVENTOR(S) : Frank Check It is certified that error appears in the above-identified patent and that said Letters Patent is hereby corrected as shown below:

Referring to the figures in the accompanying Drawings, the various illustrative embodiments of the diffractive-based laser scanning system (and components therein) of the present invention will be described in greater detail, wherein like elements will be indicated using like reference numerals.

In Column 8, the third and fifth paragraphs should read as follows:

The photodetector 111 (which may be, for example, one or more photo-diodes) generates a first electrical signal 112 whose amplitude is proportional to the intensity of the laser light beam portions $I_1''''$ directed thereto by the DOE(s) of the optical subsystem 103' (and is proportional to the characteristic wavelength of the laser light beam $I_1$ emitted from the laser light source 101'). The first electrical signal 112 generated by the photodetector 111 is supplied to signal processing circuitry 113 that generates a mode switching signal 114 representing change in characteristic wavelength of the laser light beam $I_1$ emitted from the laser light source 101' based upon the first electrical signal 112. Preferably, the signal processing circuitry 113 amplifies and filters the first electrical signal 112 in order to improve the signal-to-noise ratio (SNR) of the mode switching signal 114.

Preferably, the temperature control element 118 includes a passive cooling element (such as a heat sink that dissipates heat to ambient air) and an active heating element (such as a heating resistor or other active heating element affixed to the heat sink) placed in thermal contact with the laser light source 101'. In this preferred embodiment, the temperature controller 116 increases temperature (i.e., heats) of the laser light source 101' by applying (or increasing) power supplied to the active heating element, and decreases temperature (i.e., cools) of the laser light source 101' by cutting-off (or decreasing) power supplied to the active heating element (thereby allowing the passive cooling element to cool the laser light source 101').

UNITED STATES PATENT AND TRADEMARK OFFICE
CERTIFICATE OF CORRECTION

| | | |
|---|---|---|
| PATENT NO. | : 7,534,994 B2 | |
| APPLICATION NO. | : 11/810054 | |
| DATED | : May 19, 2009 | |
| INVENTOR(S) | : Frank Check | |

It is certified that error appears in the above-identified patent and that said Letters Patent is hereby corrected as shown below:

In Column 9, the fourth paragraph should read as follows:

Figs. 4(A) and (B) are plots of the change in characteristic wavelength of light emitted from the laser light source 101' (represented by the "mode switching" signal generated by the signal processing circuitry 113 of Fig. 2) as temperature of the diffractive-based laser scanning system 100', and the laser light source 101' embodied therein (represented by the "temperature" signal) varies over time. In addition, Figs. 4(A)-(B) depict an exemplary temperature control signal that is generated by the temperature controller 116 in response to the values of the mode switching signal supplied thereto over time. The temperature control signal is supplied to the temperature control element 118 to selectively heat (or cool) the laser light source 101', to thereby minimize and avoid changes in characteristic wavelength of the laser light beam emitted from the laser light source 101'. Note that changes in the characteristic wavelength of light emitted from the laser light source 101' still occur sporadically as the temperature varies over time; however, the duration of the time periods in which such wavelength changes occur is significantly decreased, thereby mitigating any potential problems caused by such wavelength changes (for example, unwanted distortion and signal processing errors as described above).

In Column 13, the fourth and last paragraphs should read as follows:

In addition, the digital signal processing circuitry includes symbol decoding circuitry that primarily functions to receive the digital word sequence $D_3$ produced from its respective digitizing circuitry, and subjects it to one or more bar code symbol decoding algorithms in order to determine which bar code symbol is indicated (i.e. represented) by the digital word sequence $D_3$.

Fig. 5(E)(i) and 5(E)(ii) illustrate an exemplary embodiment of the laser production modules 147A of Figs. 5(B) and 5(C) including: a visible laser diode (VLD) 101A, an aspheric collimating lens 51 supported within the bore of a housing 53 mounted upon the optical bench 143 of the module housing for collimating the laser light produced by the VLD 101A; a mirror 55, supported within the housing 53, for directing the collimated laser light produced by lens 51 to a multi-function light diffractive grating 57 (sometimes referred to by Applicants as "multi-function HOE" or "multi-function plate") supported by the housing 53. The multi-function light diffractive

UNITED STATES PATENT AND TRADEMARK OFFICE
CERTIFICATE OF CORRECTION

PATENT NO. : 7,534,994 B2
APPLICATION NO. : 11/810054
DATED : May 19, 2009
INVENTOR(S) : Frank Check It is certified that error appears in the above-identified patent and that said Letters Patent is hereby corrected as shown below:

grating 57, having a fixed spatial frequency and disposed at incident angle relative to the outgoing laser beam provided by the mirror 55, produces a primary beam that is directed toward the facets of the rotating scanning disk 130 and a zeroth diffraction order beam (whose intensity is relatively weak compared to the intensity of the primary beam output therefrom). The multi-function light diffractive grating 57 changes the properties of the incident laser beam so that the aspect ratio of the primary beam is controlled, and beam dispersion is minimized upon the primary laser beam exiting the holographic scanning disc 130. Details for designing the multi-function light diffractive grating 57 and configuring the laser scanning beam module 147A of the illustrative embodiment ~~is~~ are described in greater detail in Applicants' prior US Patent Application Serial No. 08/949,915 filed October 14, 1997, and incorporated herein by reference in its entirety.

In Column 15, the fourth paragraph should read as follows:

The mode switching signal 114A is supplied to a temperature controller 116A, which is preferably realized as one or more integrated circuits mounted on the PC board 202A as shown, that operates, in conjunction with a temperature control element 118 A in thermal contact with the VLD 101A, to adjust temperature of the VLD 101A (if need be) based upon the values of the mode switching signal 114A supplied thereto, to thereby minimize and avoid changes in characteristic wavelength of the laser light beam emitted from the VLD 101A. A more detailed description of exemplary control routines executed by the temperature controller 116A in adjusting the temperature of the VLD 101A based upon the values of the mode switching signal 114A to thereby minimize and avoid changes in characteristic wavelength of the laser light beam emitted from the VLD 101A are described below with respect to Figs. 8(A) - 8(D)(iii)(a).

UNITED STATES PATENT AND TRADEMARK OFFICE
CERTIFICATE OF CORRECTION

| | |
|---|---|
| PATENT NO. | : 7,534,994 B2 |
| APPLICATION NO. | : 11/810054 |
| DATED | : May 19, 2009 |
| INVENTOR(S) | : Frank Check |

It is certified that error appears in the above-identified patent and that said Letters Patent is hereby corrected as shown below:

In Column 19, the last paragraph should read as follows:

Note that because the laser beam incident on the multifunction light diffractive grating 57 is amplitude modulated at a frequency $f_0$, the changes ~~is~~ in wavelength of the VLD cause amplitude variations in the zeroth diffraction order laser beam about the reference frequency $f_0$. Also note that monitoring the zeroth diffractive order beam for detecting mode switching (i.e., change in characteristic wavelength) of the VLD has many advantages. More specifically, because direction of the zeroth diffractive order beam is not sensitive to changes in wavelength of the VLD, there is no angular shift in the zeroth diffractive order beam as the wavelength of the VLD changes. These properties enable a single photodetector aligned with the zeroth diffractive order beam (and associated signal processing and control circuitry) to detect (and correct for) mode switching of the VLD, which is a simple, elegant, compact and cost-effective design.

In Column 20, the third paragraph should read as follows:

The mode switching signal 114-B is supplied to a temperature controller 116-B, which is preferably realized as one or more integrated circuits mounted within the housing 3373 as shown, that operates, in conjunction with a temperature control element 118-B in thermal contact with the VLD 101-B, to adjust temperature of the VLD 101-B (if need be) based upon the values of the mode switching signal 114-B supplied thereto, to thereby minimize and avoid changes in characteristic wavelength of the laser light beam emitted from the VLD 101-B. A more detailed description of exemplary control routines executed by the temperature controller 116-B in adjusting the temperature of the VLD 101-B based upon the values of the mode switching signal 114-B to thereby minimize and avoid changes in characteristic wavelength of the laser light beam emitted from the VLD 101-B are described below with respect to Figs. 8(A) - 8(D)(iii)(a).

UNITED STATES PATENT AND TRADEMARK OFFICE
CERTIFICATE OF CORRECTION

PATENT NO. : 7,534,994 B2
APPLICATION NO. : 11/810054
DATED : May 19, 2009
INVENTOR(S) : Frank Check It is certified that error appears in the above-identified patent and that said Letters Patent is hereby corrected as shown below:

In Column 22, the first, third and fourth paragraphs should read as follows:

The temperature controller 116A, which is preferably realized as a microcontroller mounted on the PC board 202A as shown, operates, in conjunction with a temperature control element 118A in thermal contact with the VLD 101A, to adjust temperature of the VLD 101A (if need be) based upon the levels of the mode switching signal supplied thereto, to thereby minimize and avoid changes in characteristic wavelength of the laser light beam emitted from the VLD 101A. A more detailed description of exemplary control routines executed by the temperature controller 116A in adjusting the temperature of the VLD 101A based upon the values of the mode switching signal to thereby minimize and avoid changes in characteristic wavelength of the laser light beam emitted from the VLD 101A are described below with respect to Figs. 8(A) - 8(D)(iii)(a).

As shown in Fig. 7(B), the optical detector 111A may comprise one or more photo-diodes (one shown), which produces an electrical signal indicative of the detected intensity the zeroth diffractive order laser beam produced from the diffractive optical element employed by the system (which is proportional to the characteristic wavelength of the laser light beam emitted from the VLD 101A). The output of the photodiode (i.e., the first electrical signal 112A) is supplied to the signal processing circuitry 113A.

The signal processing circuitry 113A includes a pre-amplifier that amplifies and filters the output of the photodiodes to improve the signal to noise ratio therein. An AC coupling network provides DC isolation between the pre-amplifier and a high gain amplifier (which may be realized as a differential amplifier as shown). The resultant signal generating the high gain amplifier is provided to an RC network that generates two electrical signals: the first electrical signal represents an average wavelength of the laser light beam over a predetermined time period; and the second electrical signal represents current wavelength of the laser light beam. The first electrical signal is generated by the network R7, C11. These two signals are converted to N bit digital signals (for example by a multiplexer and analog-to-digital converter as shown) and supplied to the temperature controller via its I/O ports (not shown). The temperature controller 116A is preferably realized as a microcontroller mounted on the PC board 202A.

UNITED STATES PATENT AND TRADEMARK OFFICE
CERTIFICATE OF CORRECTION

| | |
|---|---|
| PATENT NO. | : 7,534,994 B2 |
| APPLICATION NO. | : 11/810054 |
| DATED | : May 19, 2009 |
| INVENTOR(S) | : Frank Check |

It is certified that error appears in the above-identified patent and that said Letters Patent is hereby corrected as shown below:

In Column 23, the second and third paragraphs should read as follows:

The temperature controller 116A, operates, in conjunction with a temperature control element 118A in thermal contact with the VLD 101A, to adjust temperature of the VLD 101A (if need be) based upon the levels of the digital mode switching signal supplied thereto, to thereby minimize and avoid changes in characteristic wavelength of the laser light beam emitted from the VLD 101A. A more detailed description of exemplary control routines executed by the temperature controller 116A in adjusting the temperature of the VLD 101A based upon the values of the mode switching signal to thereby minimize and avoid changes in characteristic wavelength of the laser light beam emitted from the VLD 101A is described below with respect to Figs. 8(A) - 8(D)(iii)(a).
     Figs. 8(A) - 8(D)(iii)(a) illustrate exemplary control routines executed by the temperature controller 116A in adjusting the temperature of the VLD 101A based upon the values of the mode switching signal supplied thereto, to thereby minimize and avoid changes in characteristic wavelength of the laser light beam emitted from the VLD 101A. Any one of these control routines, when used, is preferably stored as a programmed sequence of instructions in the memory space of the temperature controller 116A and loaded therefrom for execution by the processor of the temperature controller 116A. In these control routines, a digital mode switching signal (or flag) is derived from the mode switching signal(s) generated by the signal processing circuitry 113 and indicates that mode switching (i.e., a change in characteristic wavelength) occurred during the last sampling period (for example, set to a logic level 1 as described above).

In Column 25, the second paragraph should read as follows:

As illustrated in Fig. 8(A), the control routine begins in step 15 by initializing a direction flag to a logical "UP" direction. The direction flag represents the direction of temperature adjustment within the range, either "UP" (heating) or "DOWN" (cooling). The operation then continues to a main loop (steps 20 - 320). In step 25 of the main loop, the control routine determines if the logic level of the digital mode switching signal (flag) indicates that mode switching occurred during the last sampling period (mode switching = ON). If so, operation continues to step 30 to identify the direction of temperature adjustment; otherwise the operation continues step 290 to update the pulse width output (if need be) to maintain the substantially maintain the temperature of the VLD 101A.

UNITED STATES PATENT AND TRADEMARK OFFICE
CERTIFICATE OF CORRECTION

PATENT NO. : 7,534,994 B2
APPLICATION NO. : 11/810054
DATED : May 19, 2009
INVENTOR(S) : Frank Check It is certified that error appears in the above-identified patent and that said Letters Patent is hereby corrected as shown below:

If, in step 30, the direction is UP, a heat loop is performed (steps 40 - 160) to increase the temperature of the VLD 101A as rapidly as possible in order to bring the VLD 101A out of mode switching; otherwise (the direction is DOWN), a cool loop is performed (steps 175 - 275) to decrease the temperature of the VLD 101A as rapidly as possible in order to bring the VLD 101A out of mode switching.

Claims 1, 21, 22, 26, 28, 35 and 36 should read as follows:

1. A laser scanning system comprising:
    a laser light source emitting a laser light beam having a characteristic wavelength;
    an optical subsystem, including at least one diffractive optical element, that directs a first portion of the laser light beam into a scanning region and directs a second portion of the laser light beam to an optical detector, wherein the optical detector generates a first electrical signal in response thereto;
    a temperature control element, in thermal contact with the laser light source, that is capable of adjusting the temperature of the laser light source;
    signal processing and control circuitry, operably coupled between the optical detector and the temperature control element, that generates a second electrical signal representing change in the characteristic wavelength of the laser light beam emitted from the laser light source based upon the first electrical signal, and controls the temperature control element to adjust the temperature of the laser light source based upon the second electrical signal;
    wherein said signal processing and control circuitry generates a binary mode switching signal having a logic level indicating whether said second electrical signal exceeds ~~said~~ a predetermined threshold value,
    wherein said binary mode switching signal is supplied to a microcontroller programmed to execute a control routine that controls said temperature control element so as to adjust the temperature of said laser light source in response to the logic level of said binary mode switching signal;
    wherein said control routine controls said temperature control element so as to either heat or cool said laser light source when the logic level of said binary mode switching signal indicates that a change in the characteristic wavelength of said laser light source occurred in said laser scanning system; and

UNITED STATES PATENT AND TRADEMARK OFFICE
CERTIFICATE OF CORRECTION

| | |
|---|---|
| PATENT NO. | : 7,534,994 B2 |
| APPLICATION NO. | : 11/810054 |
| DATED | : May 19, 2009 |
| INVENTOR(S) | : Frank Check |

It is certified that error appears in the above-identified patent and that said Letters Patent is hereby corrected as shown below:

wherein said control routine controls said temperature control element to maintain the temperature of said laser light source when the logic level of said binary mode switching signal indicates that a change in the characteristic wavelength of said laser light source did not occur in said laser scanning system.

2. The laser scanning system of Claim 1, wherein a lookup table is used to generate a control signal supplied to said temperature control element in order to heat, cool or maintain the temperature of said laser light source; and
    wherein the values of said control signal stored in said lookup table are based upon the value of said control signal when mode switching begins, and the time duration of mode switching.

3. The laser scanning system of claim 1, wherein the temperature adjustment of said laser light source results in a decrease in variation of the characteristic wavelength of said laser light source.

4. The laser scanning system of claim 1, wherein a zeroth order beam is produced by the at least one diffractive optical element, and wherein said optical detector is aligned with the zeroth order beam.

5. The laser scanning system of claim 1, wherein said laser light source comprises a visible laser diode.

6. The laser scanning system of claim 5, wherein the visible laser diode comprises at least one solid-state lasing element.

7. The laser scanning system of claim 1, wherein at least one diffractive optical element comprises a holographic optical element that directs light reflected off surfaces in the scanning region along a return optical path to at least one photodetector, and wherein said signal processing and control circuitry analyzes signals generated by the at least one photodetector in response to light received along the return optical path.

UNITED STATES PATENT AND TRADEMARK OFFICE
CERTIFICATE OF CORRECTION

PATENT NO. : 7,534,994 B2
APPLICATION NO. : 11/810054
DATED : May 19, 2009
INVENTOR(S) : Frank Check It is certified that error appears in the above-identified patent and that said Letters Patent is hereby corrected as shown below:

8. The laser scanning system of claim 1, wherein said optical subsystem comprises a rotating disc with multiple holographic optical elements disposed thereon for generating a scan pattern through the scanning region.

9. The laser scanning system of claim 1, wherein said laser light source and said optical subsystem generate at least one AM modulated laser beam for generating range data characterizing at least one spatial dimension of objects passing through the scanning region.

10. The laser scanning system of claim 9, wherein the at least one spatial dimension comprises a profile, volume, or velocity of the object passing through the scanning region.

11. The laser scanning system of claim 1, wherein said optical detector comprises at least one photo-diode device.

12. The laser scanning system of claim 1, wherein said temperature control element utilizes an active heating element and a passive cooling element.

13. The laser scanning system of claim 12, wherein the active heating element comprises a resistor in thermal contact with said laser light source.

14. The laser scanning system of claim 12, wherein said passive cooling element comprises a heat sink in thermal contact with said laser light source, and wherein said heat sink passively dissipates heat to ambient air.

15. The laser scanning system of claim 1, wherein said temperature control element comprises a resistive element affixed to a heat sink in thermal contact with said laser light source.

16. The laser scanning system of claim 15, wherein the temperature of said laser light source is adjusted by varying power supplied to said resistive element.

UNITED STATES PATENT AND TRADEMARK OFFICE
CERTIFICATE OF CORRECTION

PATENT NO. : 7,534,994 B2
APPLICATION NO. : 11/810054
DATED : May 19, 2009
INVENTOR(S) : Frank Check It is certified that error appears in the above-identified patent and that said Letters Patent is hereby corrected as shown below:

17. The laser scanning system of claim 15, wherein the temperature of said laser light source is adjusted by varying the duty cycle of a pulse modulated power signal supplied to said resistive element.

18. The laser scanning system of claim 1, wherein said temperature control element comprises a thermoelectric device in thermal contact with said laser light source.

19. The laser scanning system of claim 1, wherein said signal processing and control circuitry comprises a high gain amplifier for amplifying said first electrical signal.

Signed and Sealed this

Thirtieth Day of June, 2009

JOHN DOLL
*Acting Director of the United States Patent and Trademark Office*